US008760185B2

(12) United States Patent
Suto

(10) Patent No.: US 8,760,185 B2
(45) Date of Patent: Jun. 24, 2014

(54) LOW CAPACITANCE PROBE FOR TESTING CIRCUIT ASSEMBLY

(76) Inventor: Anthony J. Suto, Sterling, MA (US)

( * ) Notice: Subject to any disclaimer, the term of this patent is extended or adjusted under 35 U.S.C. 154(b) by 371 days.

(21) Appl. No.: 12/645,424

(22) Filed: Dec. 22, 2009

(65) Prior Publication Data
US 2011/0148450 A1 Jun. 23, 2011

(51) Int. Cl.
G01R 31/312 (2006.01)
(52) U.S. Cl.
USPC ............ 324/754.28; 324/754.01; 324/446; 324/754.03
(58) Field of Classification Search
USPC ............... 324/754.03, 754.07, 724, 324/755.01–758.01, 690–696, 715, 437, 324/445, 446, 754.01, 754.06, 754.1, 324/754.11
See application file for complete search history.

(56) References Cited

U.S. PATENT DOCUMENTS

| | | | |
|---|---|---|---|
| 3,975,680 A * | 8/1976 | Webb | 324/686 |
| 4,801,866 A | 1/1989 | Wixley | |
| 4,868,506 A | 9/1989 | DiStefano et al. | |
| 5,124,660 A | 6/1992 | Cilingiroglu | |
| 5,216,358 A | 6/1993 | Vaucher | |
| 5,218,294 A | 6/1993 | Soiferman | |
| 5,254,953 A | 10/1993 | Crook et al. | |
| 5,420,500 A * | 5/1995 | Kerschner | 324/72.5 |
| 5,424,633 A | 6/1995 | Soiferman | |
| 5,486,753 A | 1/1996 | Khazam et al. | |
| 5,517,110 A | 5/1996 | Soiferman | |
| 5,530,363 A | 6/1996 | Gaughan et al. | |
| 5,557,209 A | 9/1996 | Crook et al. | |
| 5,696,451 A | 12/1997 | Keirn et al. | |
| 5,747,740 A | 5/1998 | Gordon | |
| 5,986,446 A | 11/1999 | Williamson | |
| 6,104,198 A | 8/2000 | Brooks | |
| 6,113,399 A | 9/2000 | Hundt et al. | |

(Continued)

FOREIGN PATENT DOCUMENTS

EP 0 601 900 B1 6/1994
JP 63157076 A 6/1988

OTHER PUBLICATIONS

Perforated Capacitor Plates, http://personal.ee.surrey.ac.uk/Personal/D.Jefferies/perfcap.html, downloaded Dec. 22, 2009.

(Continued)

Primary Examiner — Arleen M Vazquez
Assistant Examiner — Alesa Allgood
(74) Attorney, Agent, or Firm — Wolf, Greenfield & Sacks, P.C.

(57) ABSTRACT

An improved system for capacitive testing electrical connections in a low signal environment. The system includes features that increase sensitivity of a capacitive probe. One feature is a spacer positioned to allow the probe to be partially inserted into the component without contacting the pins. The spacer may be a collar on the probe that contacts the housing of the component, contacts the substrate of the circuit assembly, or both. In some other embodiments, the spacer may be a riser extending beyond the surface of the sense plate that contacts the component, a riser portion of the component, or a combination of both. The spacer improves sensitivity by establishing a small gap between a sense plate of the probe and pins under test without risk of damage to the pins. A second feature is a guard plate of the probe with reduced capacitance to a sense plate of the probe. Reducing capacitance also increases the sensitivity of the probe.

21 Claims, 16 Drawing Sheets

(56) References Cited

U.S. PATENT DOCUMENTS

| | | | |
|---|---|---|---|
| 6,243,655 | B1 | 6/2001 | Caggiano et al. |
| 6,249,052 | B1 | 6/2001 | Lin |
| 6,401,048 | B2 | 6/2002 | Caggiano et al. |
| 6,558,168 | B2 * | 5/2003 | Iwasaki ............... 439/63 |
| 6,960,917 | B2 * | 11/2005 | Parker et al. ............ 324/538 |
| 6,998,849 | B2 | 2/2006 | Tesdahl et al. |
| 7,057,395 | B1 | 6/2006 | Williamson |
| 7,061,250 | B2 | 6/2006 | Tesdahl et al. |
| 7,075,307 | B1 | 7/2006 | Williamson |
| 7,123,022 | B2 | 10/2006 | Parker et al. |
| 7,129,714 | B2 | 10/2006 | Baxter |
| 7,132,834 | B2 | 11/2006 | Tesdahl et al. |
| 7,161,369 | B2 | 1/2007 | Parker et al. |
| 7,187,165 | B2 | 3/2007 | Jacobsen et al. |
| 7,190,157 | B2 | 3/2007 | Parker |
| 7,208,957 | B2 | 4/2007 | Schneider et al. |
| 7,224,169 | B2 | 5/2007 | Parker |
| 7,256,593 | B2 | 8/2007 | Treibergs |
| 7,259,576 | B2 | 8/2007 | Parker et al. |
| 7,307,222 | B2 | 12/2007 | Parker et al. |
| 7,307,427 | B2 | 12/2007 | Jacobsen et al. |
| 7,325,219 | B2 | 1/2008 | Jacobsen et al. |
| 7,504,589 | B2 | 3/2009 | Parker et al. |
| 7,518,384 | B2 | 4/2009 | Leinbach et al. |
| 7,982,487 | B2 | 7/2011 | Lorenz et al. |
| 8,106,305 | B2 * | 1/2012 | Goto et al. ............ 174/255 |
| 2002/0153901 | A1 | 10/2002 | Davis et al. |
| 2006/0103397 | A1 | 5/2006 | Parker et al. |
| 2006/0129955 | A1 | 6/2006 | Jacobsen et al. |
| 2010/0117674 | A1 * | 5/2010 | Hernandez ............ 324/761 |
| 2011/0042240 | A1 | 2/2011 | Ebersole et al. |
| 2011/0148446 | A1 | 6/2011 | Suto |

OTHER PUBLICATIONS

Vaucher, Analog/Digital Testing of Loaded Boards without Dedicated Test Points, IEEE International Test Conference, 325-332, 1996.

Parker, A New Probing Technique for High-Speed/High-Density Printed Circuit Boards, ITC International Test Conference, 365-374, 2004.

Doraiswamy and Grealish, Implementation of Solder-bead Probing in High Volume Manufacturing, IEEE, ITC International Test Conference, Jan. 10, 2006.

Bullock, Designing SMT Boards for In-Circuit Testability, IEEE International Test Conference, 1987.

* cited by examiner

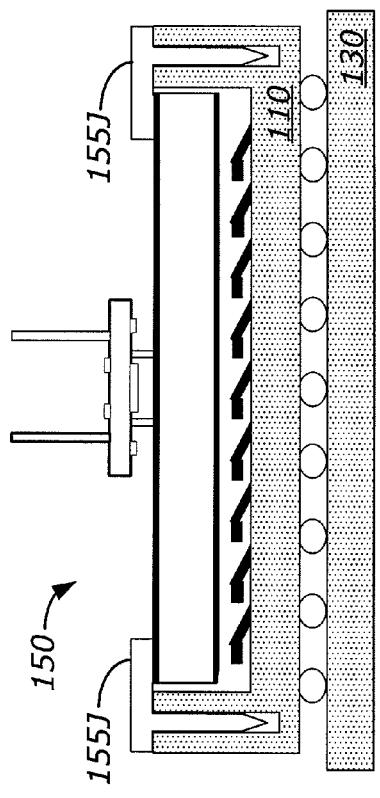
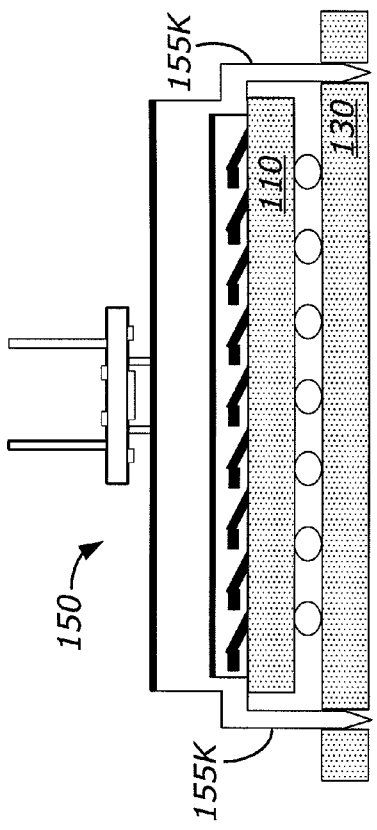
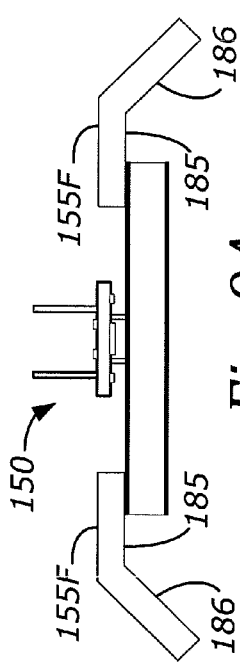
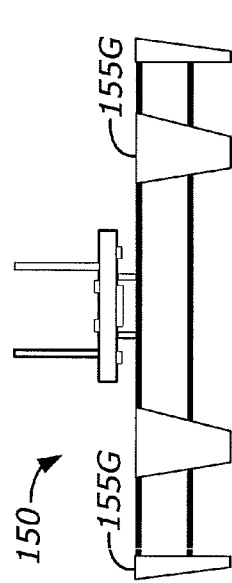
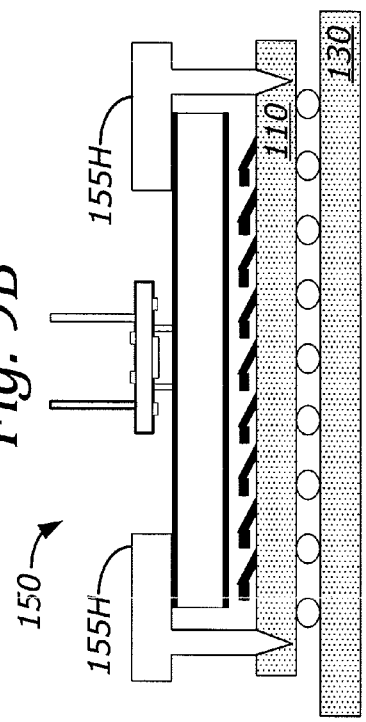

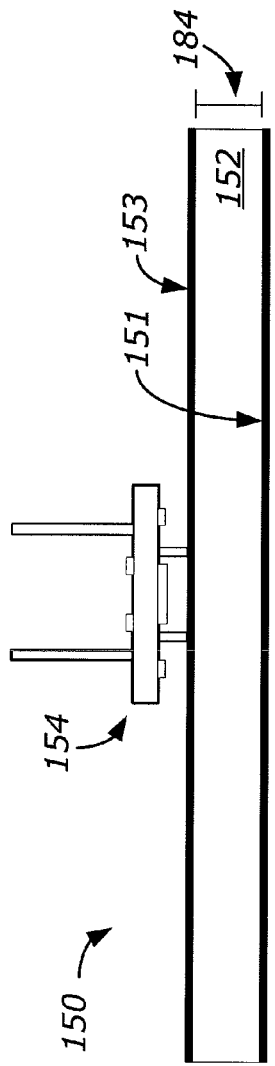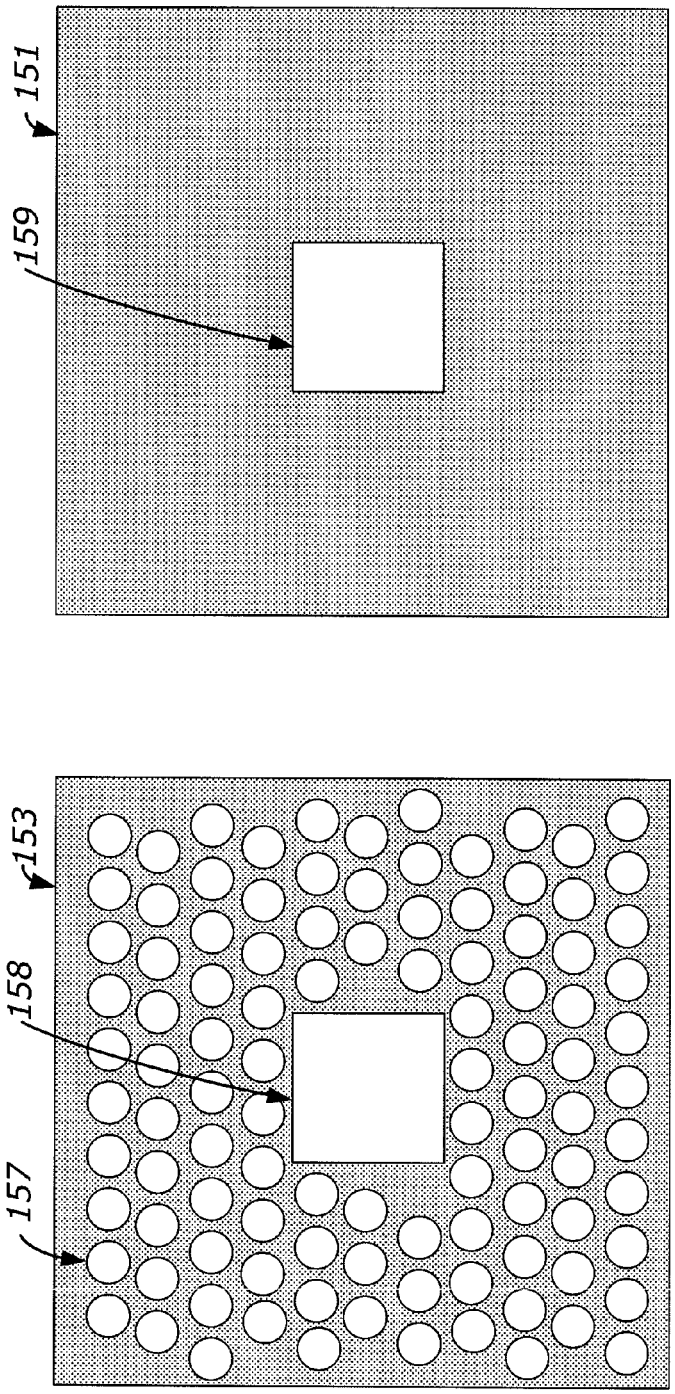

LOW CAPACITANCE PROBE FOR TESTING CIRCUIT ASSEMBLY

BACKGROUND

1. Field of the Invention

The invention relates generally to testing of circuit assemblies, and more particularly to capacitive testing of connections to pins of components of the circuit assembly.

2. Description of Related Art

During the manufacture of printed circuit board (PCB) assemblies, testing is performed at one or more stages to ensure that the finished product functions adequately. In some manufacturing operations, circuit assemblies are first tested before any components are mounted to them. The components may be separately tested before they are attached to the circuit assemblies, usually by soldering. Once the components are attached, a further test may be performed to verify that the components are properly attached. Such testing includes "opens" tests and "shorts" tests that indicate defects in attachment of contact points of the components to the circuit assembly. These contact points are generally referred to as "pins," even though the contact points may take many shapes, including posts, gull wing leads or solder balls.

One approach to testing the connections to pins is called capacitive testing. In a capacitive "opens" test, a probe that includes a sense plate is pressed against a component with a pin to be tested. A test signal is generated at a point on the circuit assembly that should be connected to the pin under test in a properly manufactured circuit assembly. If the pin under test is properly connected to the circuit assembly, the test signal will propagate from the circuit assembly through the pin to conducting structures within the component. Though the probe plate is separated from those conducting structures, the test signal can capacitively couple to the probe plate. During a test, the signal received at the probe plate is analyzed to determine whether the test signal has been capacitively coupled to the probe plate, indicating that there is a good connection between the assembly and the pin of the component.

Though capacitive testing may be desirable, it has not been widely used for certain types of components. For example, sockets have not been widely tested using capacitive test techniques. Sockets generally contain a cavity shaped to receive a semiconductor chip or other component. The pins of the socket extend into the cavity and provide spring contacts to which the other component can be connected. The socket can be soldered to the circuit assembly and the chip can later be inserted. When the socket is tested without the component inserted, there is little conductive structure in the socket through which a test signal applied to a pin under test can couple to a probe plate. Accordingly, even when a pin under test is properly connected to a circuit assembly, it is difficult to reliably detect a capacitively coupled test signal, increasing the likelihood of errors when testing pins of a socket capacitively.

In some instances, the probe has been inserted into the socket to increase the amount of the test signal coupled to the probe plate. However, inserting a probe into the cavity introduces a substantial risk of contacting and damaging the pins.

Also, it is known to include a guard plate in a probe for capacitive testing. The guard plate shields the sense plate from electrical noise that could change the signal detected at the sense plate enough to produce an erroneous test result.

SUMMARY

A probe for capacitive testing in a low signal environment is provided by reducing capacitance between a sense plate and a guard plate of the probe. Reduced capacitance may be achieved through the shape of the guard plate. For example, the guard plate may have a plurality of holes, which reduce the capacitance between the guard and sense plate. Reducing this capacitance increases the magnitude of the signal coupled to the sense plate from the test pin when the probe is used as part of a system for testing circuit assemblies.

The holes on the guard plate may be of any suitable size and shape and distributed randomly or in a pattern. In some embodiments, the holes have a circular shape and are arranged in rows. In some embodiments, the conductive surface area of the sense plate is reduced by 25% or more.

The sense plate may be electrically connected to an amplifier to amplify the signal coupled from the test pin. The holes in the guard plate to reduce capacitance may be separate from holes in the guard plate to pass an electrical lead from the amplifier to the sense plate.

The probe may be used as part of a system for testing circuit assemblies. The probe may be used during a test phase of a circuit assembly manufacturing process to determine whether pins of a component on the assembly have a good electrical connection to the assembly's substrate.

The foregoing is a non-limiting summary of the invention which is defined by the attached claims.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings:

FIG. 9A is a cross-section of a probe having a beveled spacer adapted to self-align the probe up with a component of a circuit assembly;

FIG. 9B is a cross-section of a probe having a plurality of beveled spacers adapted to self-align the probe up with a component of a circuit assembly;

FIG. 9C is a cross-section illustrating a portion of a test setup including a probe having a tapered spacer adapted to self-align the probe with a component of a circuit assembly;

FIG. 9D is a cross-section illustrating a portion of a test setup including a probe having a plurality of spacers adapted to self-align the probe with a component of a circuit assembly;

FIG. 9E is a cross section illustrating a portion of a test setup including a probe having a plurality of spacers adapted to self-align the probe with a component of a circuit assembly;

FIG. 10A is a cross-section illustrating a low capacitance probe assembly;

FIG. 10B is a plan view of a guard plate of a low capacitance probe according to some embodiments;

FIG. 10C is a plan view of a sense plate of a low capacitance probe according to some embodiments;

DETAILED DESCRIPTION

The inventor has recognized and appreciated that capacitive opens testing for some types of circuit components, including chip sockets, has been limited because of the risk of damaging the components during the testing process which has led to the test probe being separated from the component under test by too great a distance for a test signal to be reliably detected. The inventor has recognized and appreciated that capacitive testing can be made feasible by reducing the risk of damage to components by using spacers to ensure proper alignment of a test probe with a respective component of a circuit assembly to be tested. Such spacers may be configured to ensure that when a probe assembly is moved into the testing position, a gap of predetermined size exists between the probe assembly and the pins of the component. In addition to ensuring the proper vertical spacing (i.e., a gap), the spacers may be configured to assist in the lateral alignment of the probe with the component. Beveled or tapered surfaces may be used to guide the probe into the proper testing position.

The inventor has further recognized that the quality of a signal coupled to a test probe may be improved by using a low capacitance probe for testing. The low capacitance effectively increases the amplitude of the response signal coupled to the probe from the component. Increasing the response signal's amplitude improves the signal to noise ratio and the reliability of the test result. The inventor has recognized and appreciated that a low capacitance probe may be achieved by reducing the surface area of a guard plate. The surface area may be reduced by providing holes over the surface of the guard plate. A suitable set of holes reduces the probe's capacitance while still providing protection from noise in the test environment.

Figures 1A, 1B:
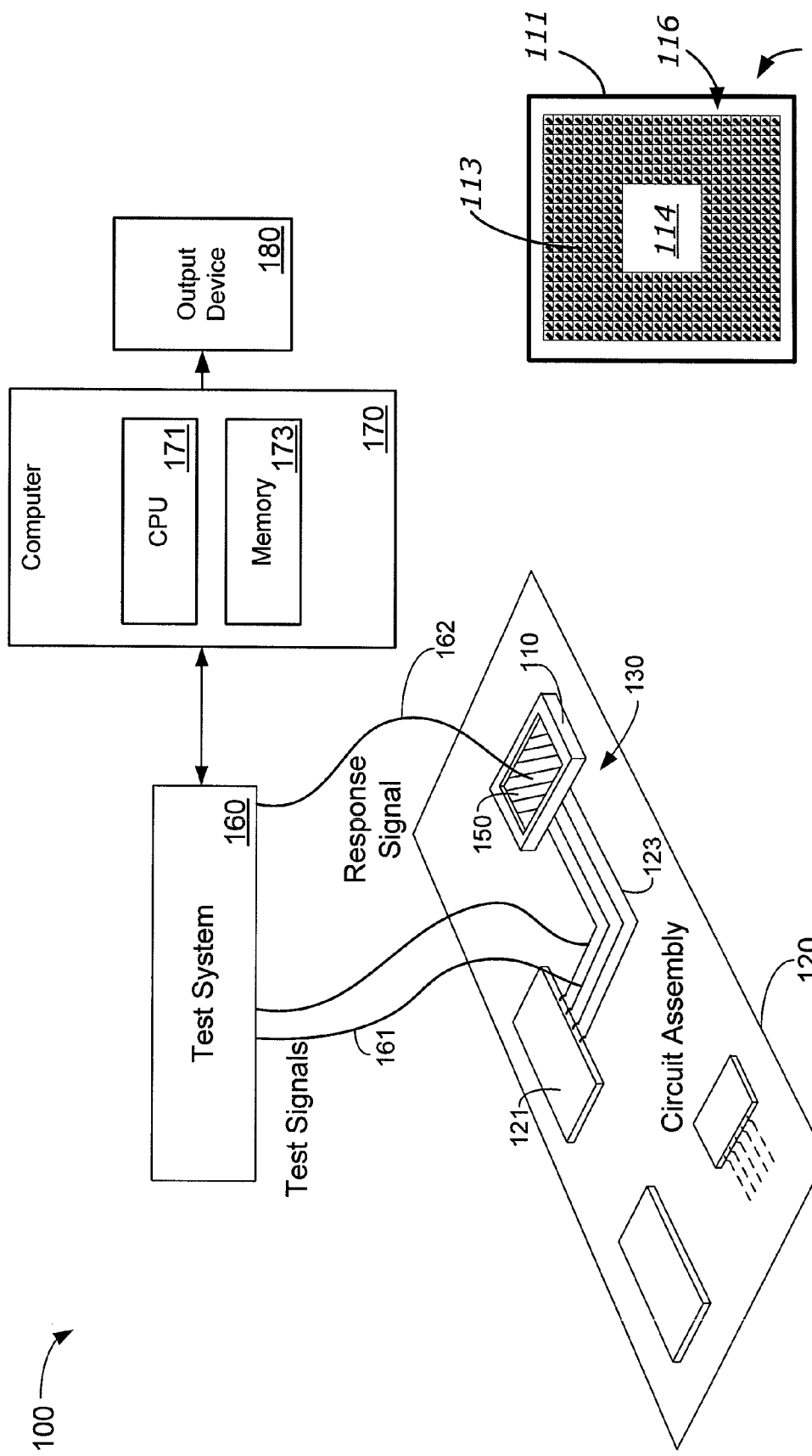
FIG. 1A is a sketch of a test setup configured for capacitive testing in which embodiments of the invention may be practiced.
FIG. 1B is a top view of a component that may be tested using the inventive principles as described herein.

FIG. 1A illustrates a test setup 100 for testing a component 110 of a circuit assembly 120. Such a setup may be used as part of a manufacturing process for producing circuit assemblies. Circuit assembly 120 includes a substrate 130, such as a printed circuit board (PCB), and any number of devices and components such as device 121 and component 110. Circuit assembly 120 may be mounted in a fixture of test setup 100 (not shown) during the testing procedure. The fixture may include a fixture over-clamp (also not shown) to which probe assembly 150 is connected. The fixture over-clamp may be movable to allow circuit assembly 120 to be removed and replaced with the next circuit assembly to be tested. In some embodiments, the fixture over-clamp has a clam shell design which allows probe assembly 150 to be lowered into an appropriate position for conducting a test and raised to replace the circuit assembly with another circuit assembly to be tested.

According to some embodiments, a test system 160 performs a capacitive opens test on a pin 113 on a component 110 by generating a test signal on a signal lead 161 (see also FIG. 1B). The test signal is then coupled to a signal path 123 on circuit assembly 120 that, in a properly manufactured circuit assembly, is coupled to the pin under test. Signal path 123 may be any suitable type of electrical trace for propagating signals on circuit assembly 120. The test signal may include a time varying signal, which, if the pin under test is properly connected to circuit assembly 120, is coupled to the pin. For example, if the pin under test is pin 113 in component 110, the test signal will be coupled to pin 113 within component 110. During this test, other signal paths on circuit assembly 120 may be held at a constant voltage by test system 160 during the test or not driven. Though, in embodiments in which a test signal on other signal paths will not interfere with the testing of pin 113, other signal paths may simultaneously be driven with other test signals. Other possible test actions are possible, but for simplicity, not illustrated in FIG. 1.

To test the connection of pin 113 to circuit assembly 130, probe assembly 150 is positioned near component 110. The nature of the signal coupled to probe assembly 150 may indicate whether pin under test 113 is properly connected.

Probe assembly 150 includes a sense plate to which the test signal may be capacitively coupled from pin under test 113. The properties, such as the amplitude, of the test signal coupled to probe assembly 150 will depend on the quality of the connection between the signal path 123 and pin under test 113. For example, a large coupled signal may indicate the pin under test is properly connected while a small coupled signal may suggest the signal path and the pin under test have a poor electrical connection. Though, the interpretation of the response signal may depend on the type of test being performed.

Whatever signal is coupled to probe assembly 150 may be amplified and provided, via signal path 162, to test system 160. Test system 160 and computer 170 may be configured to analyze the response signal and to assess the quality of the electrical connection between the signal path and the pin under test. The response signal may be digitized by a suitable analog-to-digital converter to facilitate analysis. Test system 160 may perform signal processing of the response signal before providing the response signal to a computer 170. Computer 170 may be configured to perform further analysis of the response signal to make a determination about the electrical connection between signal path 123 and pin under test 113. Specifically, features of the response signal are analyzed by computer 170 to determine whether the connection is "good" or "bad." The particular thresholds and signal features computer 170 uses to make a determination may be identified empirically during a learn phase or in any other suitable way. During the learn phase, measurements are made on a properly assembled circuit assembly such that the characteristics of response signals when there is a good electrical connection between a signal path and a pin under test may be identified.

As illustrated, test setup 100 is configured to test an electrical connection between signal path 123 and pin under test 113 on component 110. Because the same test process may be used for each of pins 116 on component 110 and each component on circuit assembly 120, testing is described in connection with a single pin on a component for simplicity. However, it should be understood that other pins on the same component and pins associated with other components could be tested in a similar fashion, at different times, or, where signals associated with testing of one component or pin will not interfere with testing of others, at the same time.

It should be appreciated that FIG. 1 illustrates one approach to generating test signals, but other approaches are possible. In the embodiment illustrated in FIG. 1A, test system 160 is connected to signal path 123 directly by signal lead 161. In some other embodiments, the test system 160 may be configured to control another device, such as device 121, to act as a virtual signal generator that generates test signals onto signal leads. Test system 160 may be configured to generate test signals on signal paths in any suitable way. Further description of methods of capacitive testing may be found, for example in "Method and apparatus for testing electrical connections on a printed circuit board" U.S. Provisional Patent Application Ser. No. 61/115,005 and "Fast open circuit detection for open power and ground pins," U.S. Provisional Patent Application Ser. No. 61/115,011 both of which are herein incorporated by reference in their entirety. These patent applications describe techniques in which capacitive tests are performed using test signals of various formats and good or bad pins are detected based on measurements associated with multiple pins under test simultaneously, which can allow detection of faults instead of or in addition to opens. Accordingly, it should be appreciated that the techniques described herein are applicable to any form of capacitive testing of circuit assemblies.

Though any suitable components may be used to conduct capacitive tests, as shown in FIG. 1A, computer 170 has a processing unit 171 and memory 173, but this configuration is only an example. Though illustrated as separate units, test system 160 and computer 170 may be embodied as a single device or implemented in any other suitable way.

Processor 171 may be any suitable processing device such as, for example and not limitation, a central processing unit (CPU), digital signal processor (DSP), controller, addressable controller, general or special purpose microprocessor, microcontroller, addressable microprocessor, programmable processor, programmable controller, dedicated processor, dedicated controller, or any other suitable processing device.

Memory 173 may be integrated into processor 171 and/or may include "off-chip" memory that may be accessible to processor 171, for example, via a memory bus (not shown). Memory 173 may store software modules that when executed by processor 171 perform a desired function. Memory 173 may be any suitable type of computer-readable storage medium such as, for example and not limitation, RAM, a nanotechnology-based memory, one or more floppy discs, compact discs, optical discs, volatile and non-volatile memory devices, magnetic tapes, flash memories, hard disk drive, circuit configurations in Field Programmable Gate Arrays, or other semiconductor devices, or other tangible computer storage medium.

Computer 170 may be programmed to control the overall test process. For example, computer 170 may reconfigure test setup 100 to test other pins on circuit assembly 120. If computer 170 determines a test fails, additional tests may be performed to identify the cause of the failure. Computer 170 may output information about the tests to an output device 180, such as a display or printer, or may send information about defects on circuit assembly 120 to other manufacturing equipment for use in subsequent stages of manufacture.

Computer 170 may include computer executable software modules, each containing computer executable instructions. The software modules may be stored in memory 173 and executed by processor 171, though this is just an illustrative embodiment and other storage locations and execution means are possible. In some embodiments, suitable computer executable modules are used to control test system 160 for testing of circuit assembly 120.

For testing chip sockets or other components with relatively small conductive members, such as pin 113, that provide weak capacitive coupling to a sense plate in a conventional probe assembly, one or more enhancements may be used to increase the accuracy of capacitive testing. In some embodiments, a low capacitance probe, as described in greater detail below, may be used.

Alternatively or additionally, mechanical features may be used to provide a controlled spacing between a sense plate and the conductive members. The spacing may be small enough to provide reliable capacitive coupling, yet large enough to prevent contact between the probe assembly and the conductive elements, which may be easily damaged For example, probe assembly 150 may be configured for insertion into a cavity formed in a chip socket or other similar component. Spacers may be incorporated into one or more of the probe assembly, the component or the circuit assembly substrate to allow a sense plate to be positioned close to pins of the chip socket with a greatly reduced risk of damage.

Probe assembly 150 may have spacers for properly positioning a sense plate of the probe near compliant members, which are generally referred to as "pins," of component 110. These "pins" are designed to make contact with pads on a semiconductor chip when it is inserted into component 110, but are fragile and easily damaged. The spacers may have any suitable shape and may be positioned such that probe assembly contacts a housing of component 110 and/or a surface of the circuit assembly's substrate 130 to prevent the probe assembly from contacting the pins as the probe assembly is brought closer to component 110. In some embodiments, the spacers may be adjustable such that the gap between the sense plate of probe assembly 150 and the pins may be increased or decreased. For example, screws may be used to fine tune the configuration of the spacers.

Turning now to FIG. 1B, a top view of component 110 is illustrated, which may be beneficially tested as described herein. Here component 110 is a land grid array (LGA) socket. An LGA socket is one type of component 110 that may be connected to circuit assembly 120 and tested using a low capacitance probe assembly. The socket allows a microchip to be seated on a circuit assembly such that the microchip may be mechanically removed. A housing 111 provides mechanical support for pins 116 and the microchip. Housing 111 may have a side wall that acts as a "lip" that extends above the surface of pins 116. The lip may completely or partially circumscribe pins 116 forming a cavity with pins 116 positioned at the cavity's floor. Though, housing 111 may be formed in any suitable way. For example, housing 111 may have raised portions within the interior surface of component 110.

At least some of pins 116 of component 110 are intended to be connected to signal paths on circuit assembly 120 (FIG. 1A). Any suitable type or combination of types of pins may be used as part of component 110. For example, pins 116 may be male, female, hermaphroditic, zero-insertion-force (ZIF), or any other type of interface for forming an electrical connection. In some embodiments, a lever or other mechanical structure (not shown) is provided with component 110 to securely fasten and release the inserted microchip. Pins 116 may be shaped for electrical connection to the signal paths on a circuit assembly in any suitable way, for example, by soldering. In the embodiment illustrated, the solder ball attachment is used, though it should be appreciated that this form of attachment is illustrative and other forms of attachment may be used.

In the illustrated embodiment, component 110 has a region 114 devoid of pins 116. Such a feature is common in LGA sockets. Region 114 may be a center region of component 110 and may be completely surrounded by pins 116 as shown. Though, component 110 may be populated by pins 116 in any suitable way.

As noted above, a spacer to provide a controlled separation between a probe assembly and the pins of a component may be incorporated into the probe, the component and/or the circuit assembly. Accordingly, component 110 may include spacers (not shown) for limiting insertion of a probe assembly into a cavity formed within component 110. The spacers may be positioned to restrict the probe from further encroaching on the surface of pins 116 when the sense plate of the probe is a predetermined distance from pins 116. Though not shown in FIG. 1B, a component may also be shaped to assist in laterally aligning a probe over of pins 116.

Though component 110 is illustrated as an LGA socket in FIG. 1B, it should be appreciated that component 110 may be any suitable type of component that provides pins on the surface of circuit assembly 120. Component 110 may be, for example and not limitation, a socket, an LGA socket, a connector, or any other suitable type of component.

Figure 1C:
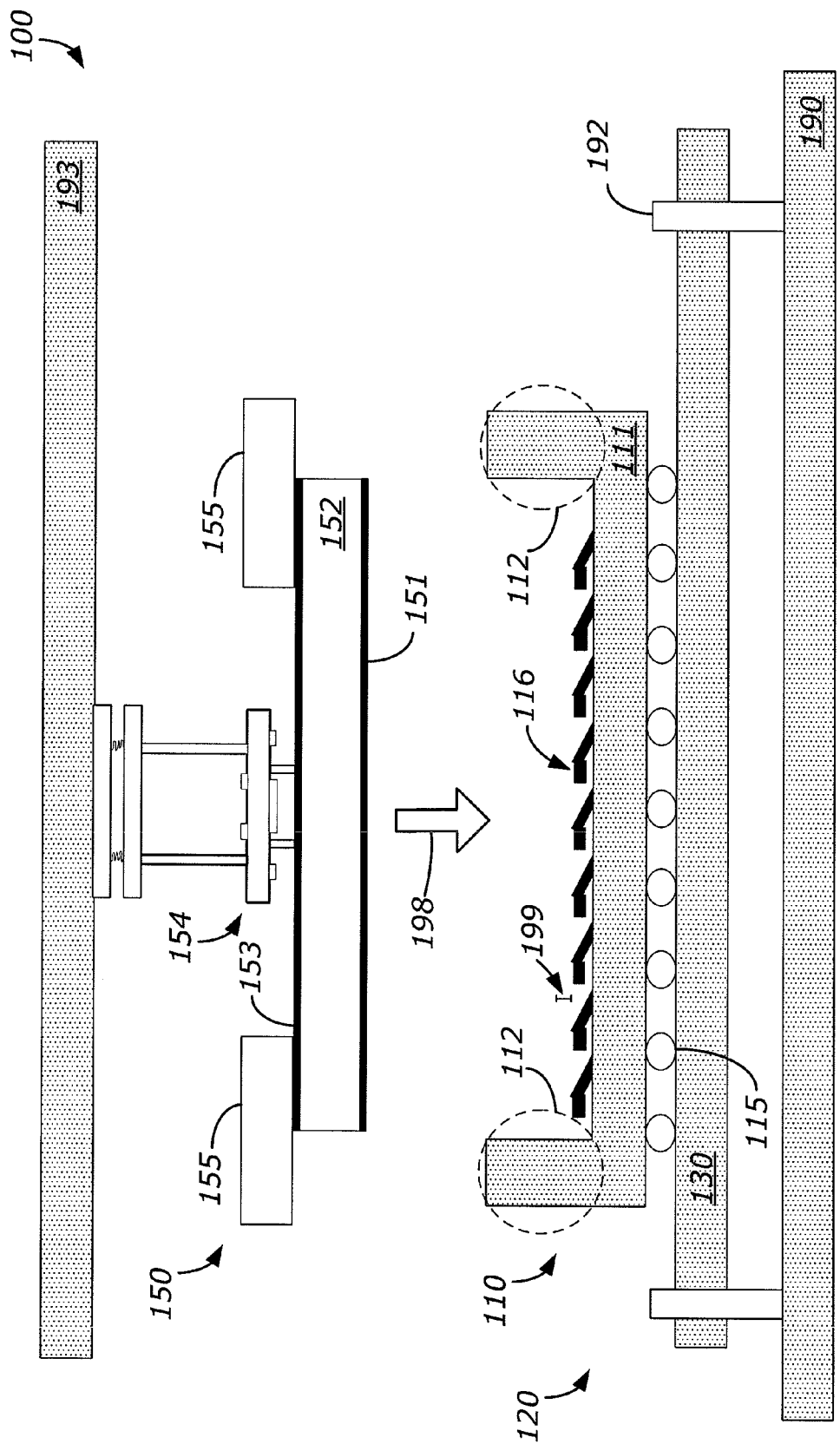
FIG. 1C is a cross-sectional view of a portion of a test setup.

FIG. 1C illustrates in cross-section a view of a portion of test setup 100. As illustrated, circuit assembly 120 may be held in place on a fixture 190 by positioning pins 192. On circuit assembly 120, pins 116 of component 110 are connected to circuit assembly substrate 130 at connection points 115. Connection points 115 may be solder joints or any other suitable type of connection for establishing electrical conductivity between pins 116 and the signal paths (not shown) formed on or in substrate 130. Connection points 115 may also provide mechanical support for component 110. Though, in some embodiments additional mechanical supports may also be used to further secure housing 111 directly to substrate 130.

Housing 111 of component 110 may have a lip 112 bounding a cavity within which pins 116 reside. Lip 112 may circumscribe the perimeter of component 110 or may be formed only at certain portions of housing 111.

FIG. 1C also illustrates a probe assembly 150 according to some embodiments. Probe assembly 150 is connected to fixture over-clamp 193. In the embodiment illustrated, probe assembly 150 includes a probe or probe head formed by a sense plate 151 separated by a dielectric 152 from a guard plate 153. Sense plate 151 and guard plate 153 may be substantially parallel with one another. Sense plate 151 and guard plate 153 may be made of any suitable highly conductive material, such as copper, gold, alloys, other metals or suitably conductive materials. Both sense plate 151 and guard plate 153 may be coupled by wires or other suitable conductors to a test system, such as test system 160 (FIG. 1A). Guard plate 153 may be grounded to aid in isolating the test environment between sense plate 151 and pins 116 from external electrical signals that could disrupt measurement of a signal coupled between pins 116 and sense plate 151.

Guard plate 153 and sense plate 151 are separated by a dielectric 152. Dielectric 152 is preferably a dielectric having low losses at least in the frequency range used for testing. Suitable dielectrics include, for example and not limitation, polytetrafluoroethylene (PTFE), polycarbonate and polyethylene, though any suitable dielectric may be used.

When fixture over-clamp 193 is lowered in direction 198 to position probe assembly 150 for testing, a gap between pins 116 and sense plate 151 is achieved through the interaction of features on probe assembly 150 with features on housing 111 of component 110. In the example illustrated in FIG. 1C, spacer 155 is provided on probe assembly 150 to allow sense plate 151 of probe assembly 150 to come in close proximity to, but not contact, pins 116. In the embodiment illustrated, spacer 155 is designed to engage lip 112 on the housing 111 of component 110.

Specifically, when spacer 155 is fully engaged with circuit assembly 120, sense plate 151 is precluded from contacting pins 116. Sense plate 151 and pins 116 are separated by a gap of a predetermined distance 199. In some embodiments, distance 199 of the gap in some embodiments may be less than 20 mils (1 mil=1/1000 inch=0.0254 mm). In other embodiments, distance 199 of the gap in some embodiments may be less than 40 mils. In some other embodiments, distance 199 of the gap may be between 10 mils and 20 mils. In yet some other embodiments, distance 199 is between 10 mils and 100 mils. Though, spacer 155 may be configured for any suitable gap width.

Spacer 155 is embodied as collar spacers in the illustration shown in FIG. 1C, though any suitable type of spacer may be used. Example configurations of spacer 155 according to some embodiments are described with reference to FIGS. 2A-9E, below. Though, those of skill in the art will appreciate that spacer 155 may take any suitable form.

Figure 2A:
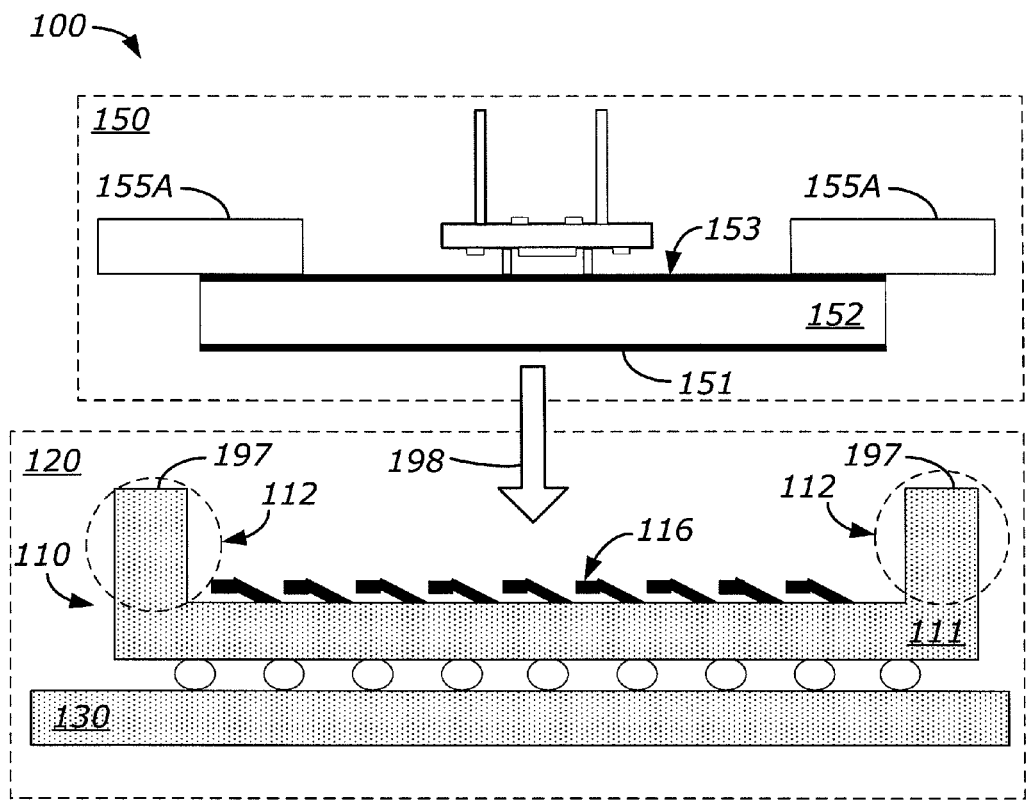
FIGS. 2A and 2B are cross-sections illustrating a portion of a test setup including a probe having a spacer adapted to contact a lip of a component housing at different stages of positioning the probe for capacitive testing of pins of the component.
Figure 2B:
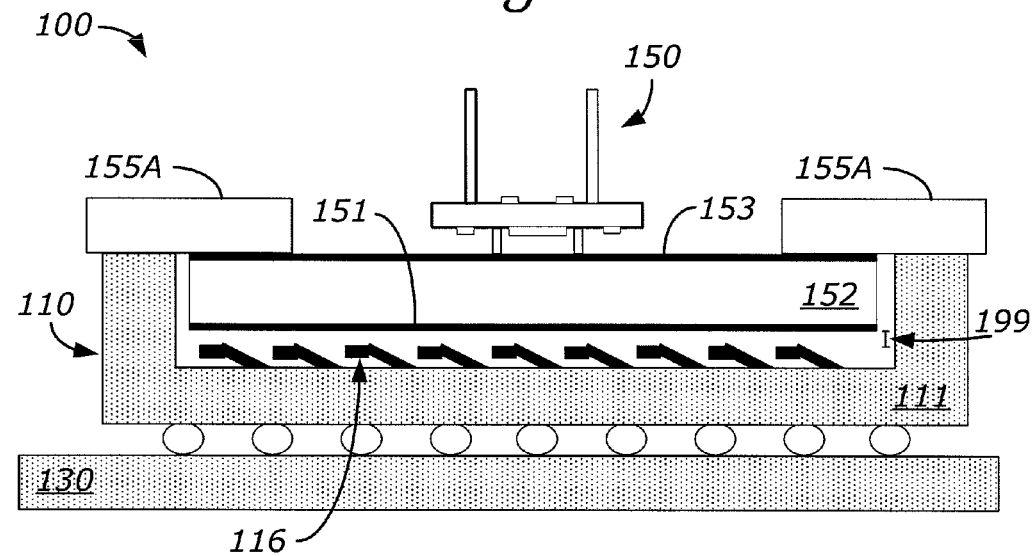

FIGS. 2A-2B illustrate in cross-section a portion of test setup 100 at different stages of positioning probe assembly 150 using a spacer according to some embodiments. In the embodiment illustrated in FIGS. 2A-2B, the spacer is embodied as collar spacers 155A. FIG. 2A illustrates probe assembly 150 and circuit assembly 120 when the fixture over-clamp (not shown) is in a raised position. FIG. 2B illustrates probe assembly 150 and circuit assembly 120 when the fixture over-clamp is in a lowered position. In the lowered position, probe assembly 150 is partially inserted into a cavity formed within component 110. The collar spacers 155A contact surfaces 197 of housing 111 when sense plate 151 is distance 199 from pins 116. When probe assembly 150 is in the fully engaged position shown in FIG. 2B, capacitive testing of pins 116 may be performed.

Collar spacers 155A may be configured to fully engage circuit assembly 120 when sense plate 151 is at any desired distance 199 from pins 116. For example, while collar spacers 155A are shown flat in the illustrated embodiment, "L" shaped collar spacers may be used to permit sense plate 151 to be positioned closer or further away from pins 116. In some embodiments, a screw or other suitable adjustment mechanism may be used to adjust distance 199. For example, a screw may control the position of collar spacers 155A relative to sense plate 151 in a direction perpendicular to the surface of sense plate 151.

Though collar spacers 155A are shown connected to guard plate 153, collar spacers 155A may be integrated into probe assembly 150 in any suitable way. Collar spacers 155A may be positioned along the entire perimeter of probe assembly 150, along select portions of the perimeter, or at any suitable portion of probe assembly 150. For example, collar spacers 155A may be located at a few discrete portions of the perimeter of probe assembly 150 such as at corners, spaced along the perimeter, or on the underside of probe assembly 150. Collar spacers 155A are provided at enough locations to ensure that when probe assembly 150 is fully engaged the probe head is seated in a stable position. For example, spacers may be provided at at least three points around the perimeter of the probe to ensure stability.

Figure 3A:
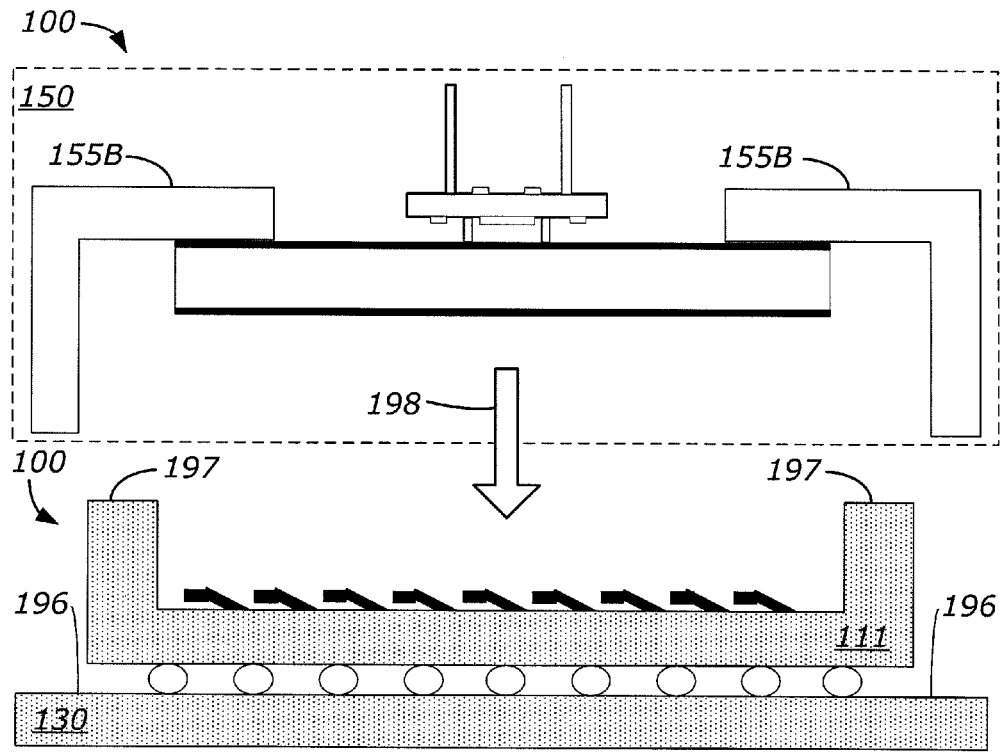
FIGS. 3A and 3B are cross-sections illustrating a portion of a test setup including a probe having a spacer adapted to contact a substrate of a circuit assembly and a lip of a component housing at different stages of positioning the probe for capacitive testing of pins of the component.
Figure 3B:
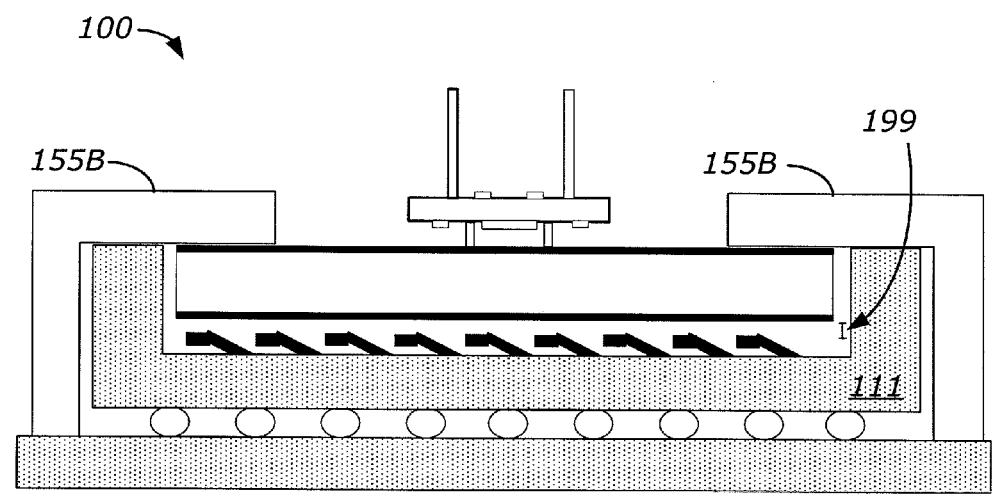

FIGS. 3A-3B illustrate in cross-section a portion of test setup 100 at different stages of positioning probe assembly 150 according to some other embodiments. Here the spacer is embodied as collar spacers 155B which are configured to engage surfaces 196 of substrate 130 instead of or in addition to surfaces 197 of housing 111.

Figure 4A:
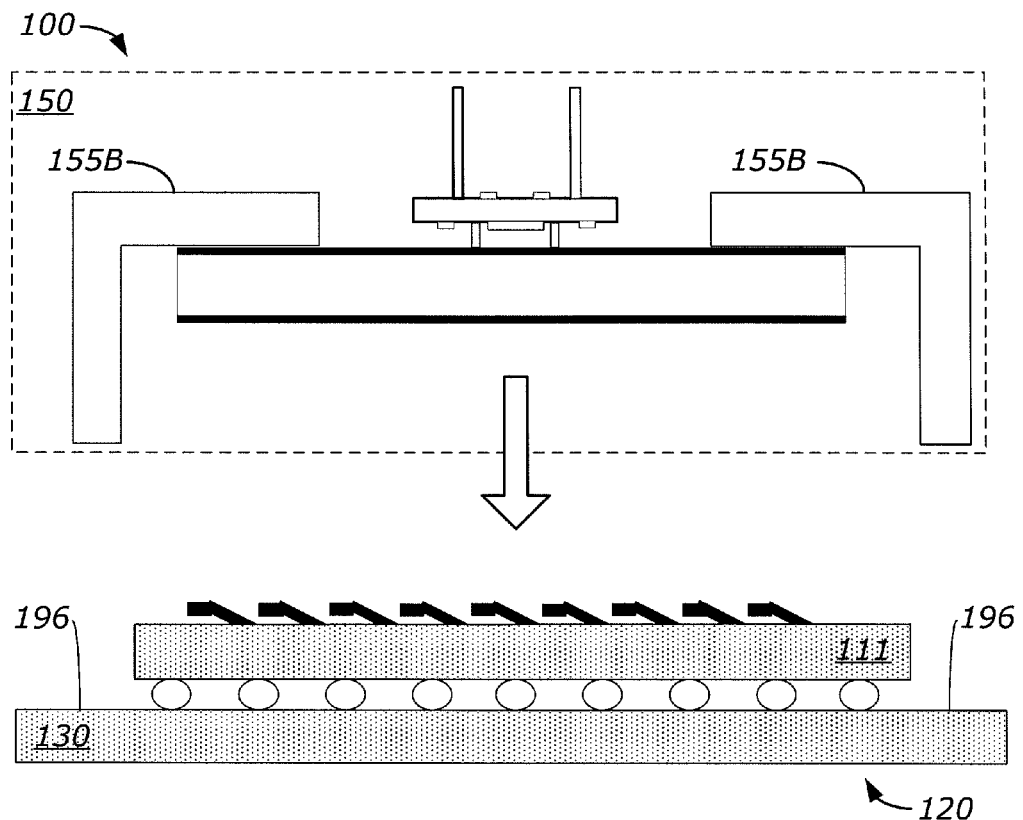
FIGS. 4A and 4B are cross-sections illustrating an alternative embodiment of a portion of a test setup including a probe having a spacer adapted to contact a substrate of a circuit assembly at different stages of positioning the probe for capacitive testing of pins of a component.
Figure 4B:
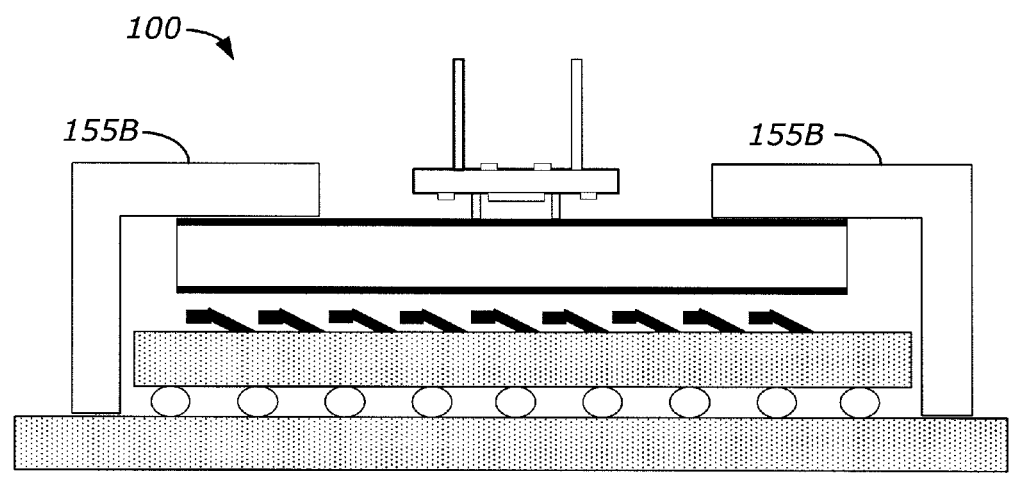

FIGS. 4A-4B illustrate in cross-sections a portion of test setup 100 at different stages of positioning probe assembly 150 according to some other embodiments. The spacer is again embodied as collar spacers 155B, though here collar spacers 155B only contacts surface 196 of substrate 130 when fully engaged. While in this example housing 111 is shown without a lip, housing 111 may have a lip portion even though collar spacers 155B only engages surface 196 of substrate 130.

FIGS. 2A-4B have illustrated several embodiments of test setup 100 where the spacer is is part of a probe assembly. It should be appreciated that a spacer may engage any suitable combination of portions of component 110 and substrate 130. Different types of spacers may be used in conjunction with test setup 100 in any suitable way. While probe assembly 150 has been depicted as moving straight down in direction 198, it should be appreciated that movement to engage probe assembly 150 with circuit assembly 120 may take any suitable form. For example, probe assembly 150 may be attached to a hinged fixture over-clamp. Thus, probe assembly may move closer to component 110 in an arc or along any suitable path. It should be appreciated that probe assembly 150 need not move in an absolute sense. Rather, relative motion between the probe assembly 150 and component 110 can achieve the desired position of probe assembly 150 and component 110, even if such relative motion is achieved by motion of the circuit assembly relative to probe assembly 150.

Figure 5A:
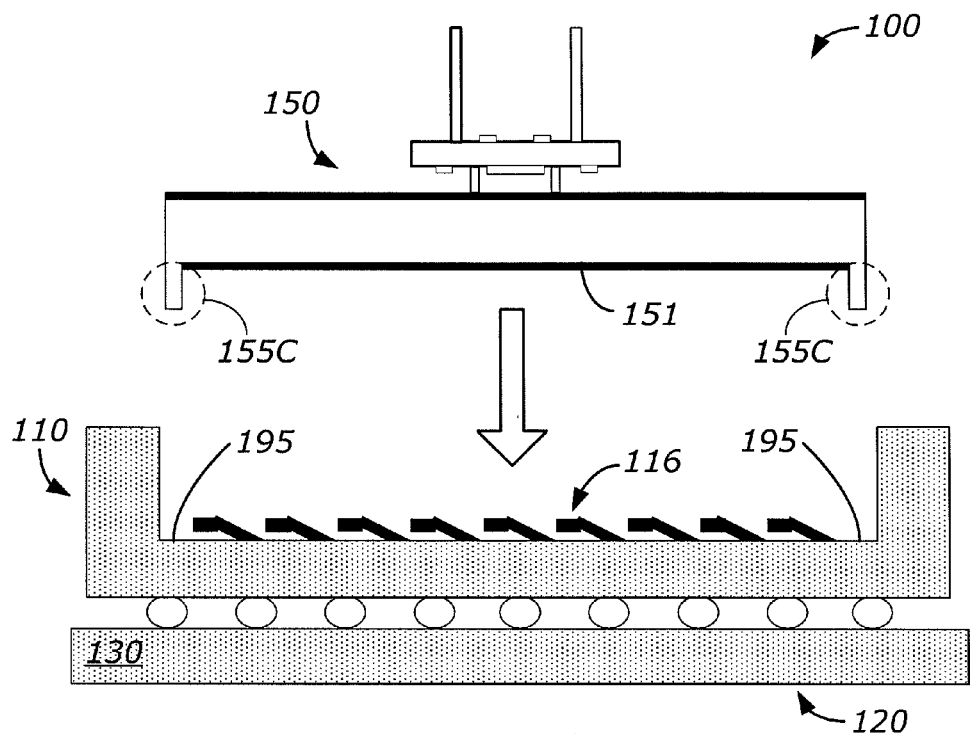
FIGS. 5A and 5B are cross-sections illustrating a portion of a test setup including a probe having a spacer adapted to contact a surface inside a cavity of a component housing at different stages of positioning the probe for capacitive testing of pins of the component.
Figure 5B:
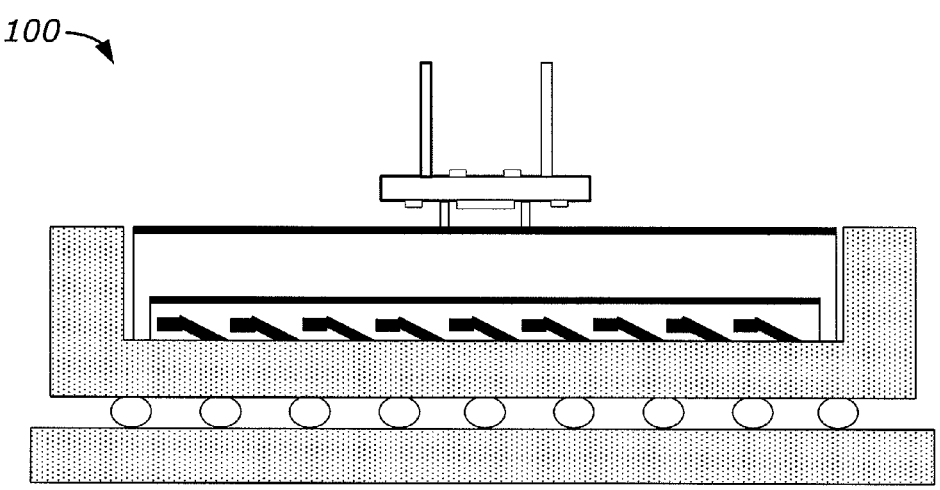

Turning now to FIGS. 5A-5B, a cross-section of a portion of test setup 100 is illustrated where the spacer is embodied in the form of risers 155C. Risers 155C are positioned to extend below the surface of sense plate 151. The riser may be positioned along the entire perimeter of probe assembly 150, along select portions of the perimeter such as at the corners, spaced along the perimeter, on the underside of probe assembly 150, or at any suitable portion of probe assembly 150. Risers 155C may be positioned to contact any suitable surface. In this example, the risers are positioned to contact a surface 195 of component 110 devoid of pins 116. Surface 195, for example, could be around the perimeter of component 110 or in the center region of an LGA socket, such a region 114 (FIG. 1B).

Figure 6A:
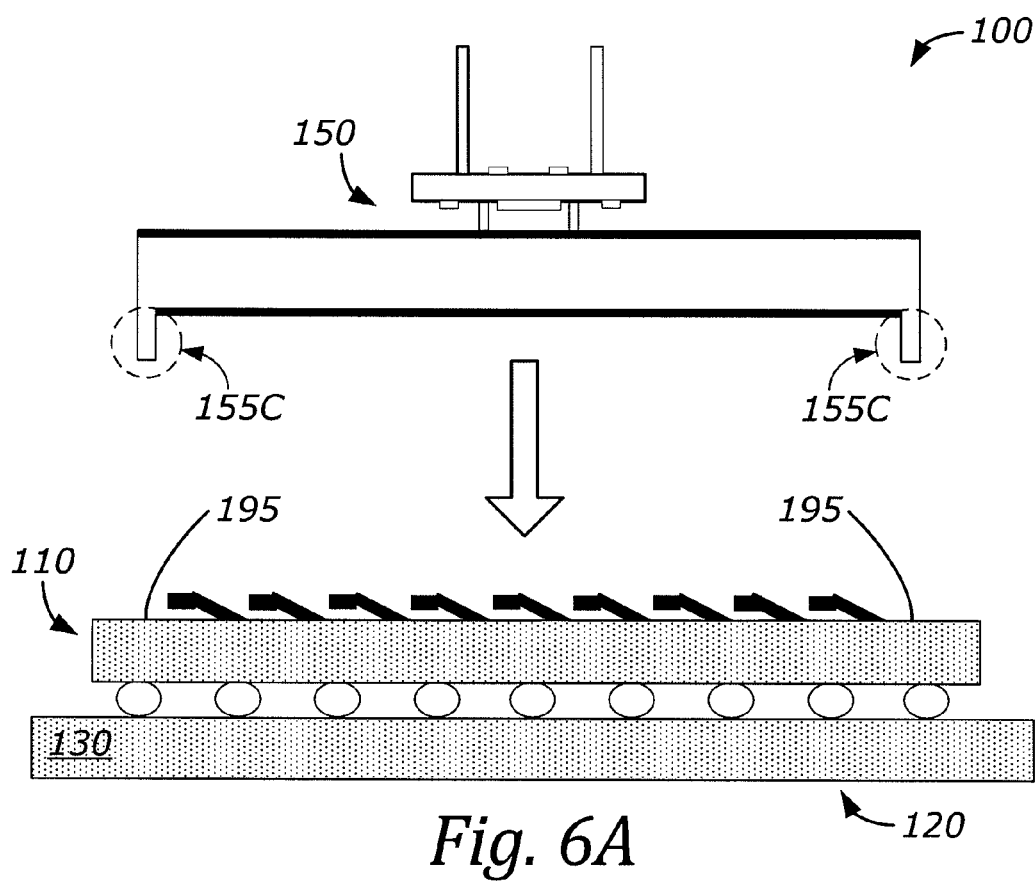
FIGS. 6A and 6B are cross-sections illustrating a portion of a test setup including a probe having a spacer adapted to contact a surface of the housing of a component at different stages of positioning the probe for capacitive testing of pins of the component.
Figure 6B:
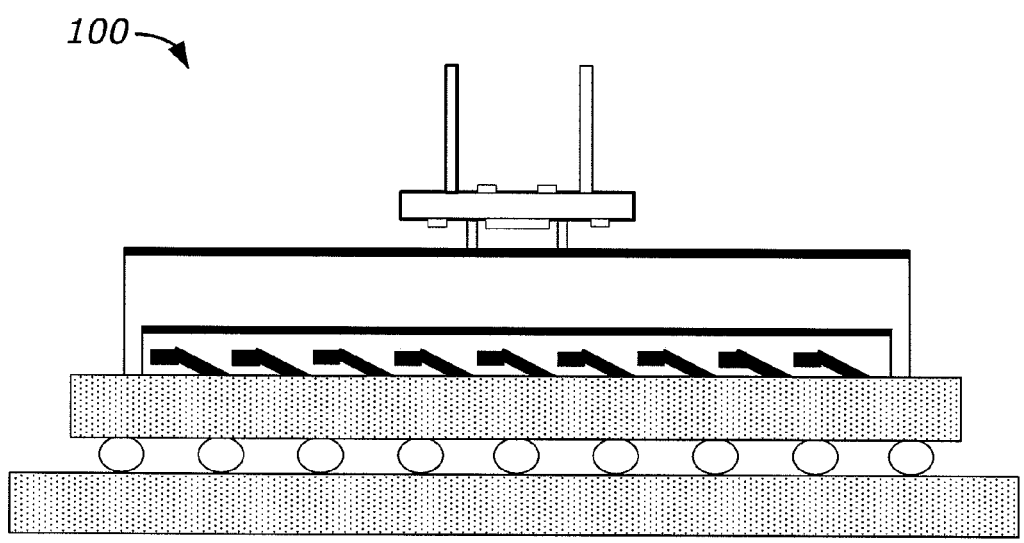

FIGS. 6A-6B show in cross-section a configuration similar to that shown in FIGS. 5A-5B. Here however, housing 111 of component 110 does not have a lip.

Figure 7A:
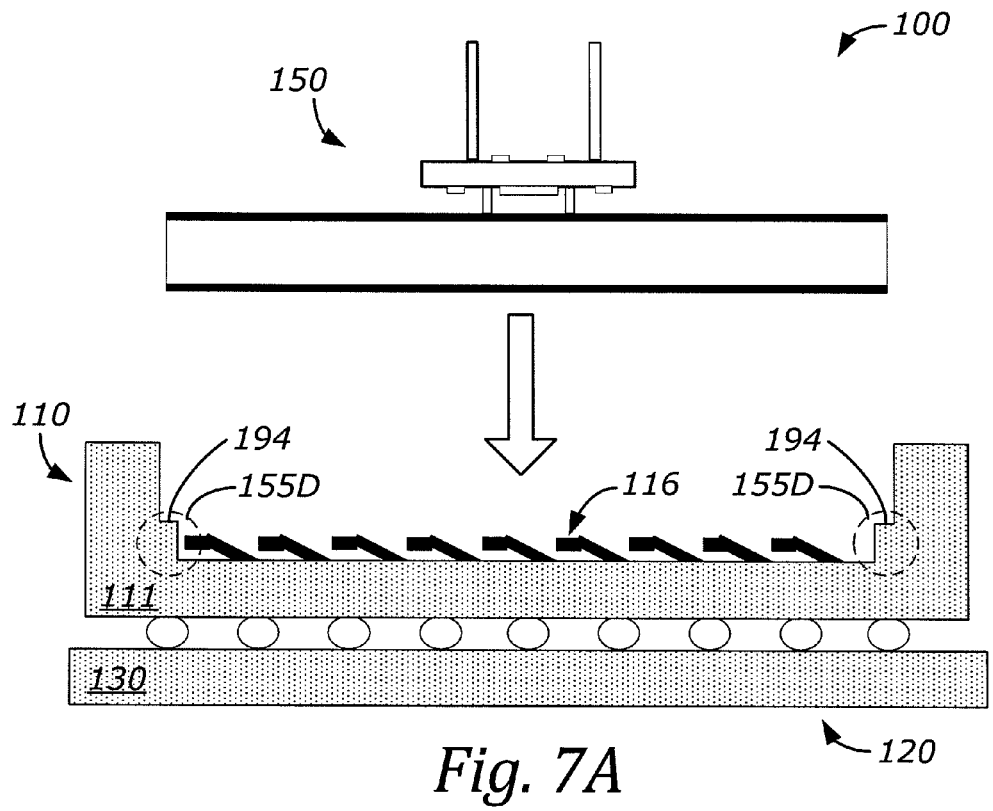
FIGS. 7A and 7B are cross-sections illustrating a portion of a test setup including a component having a housing with a spacer adapted to contact a surface of a probe at different stages of positioning the probe for capacitive testing of pins of the component.
Figure 7B:
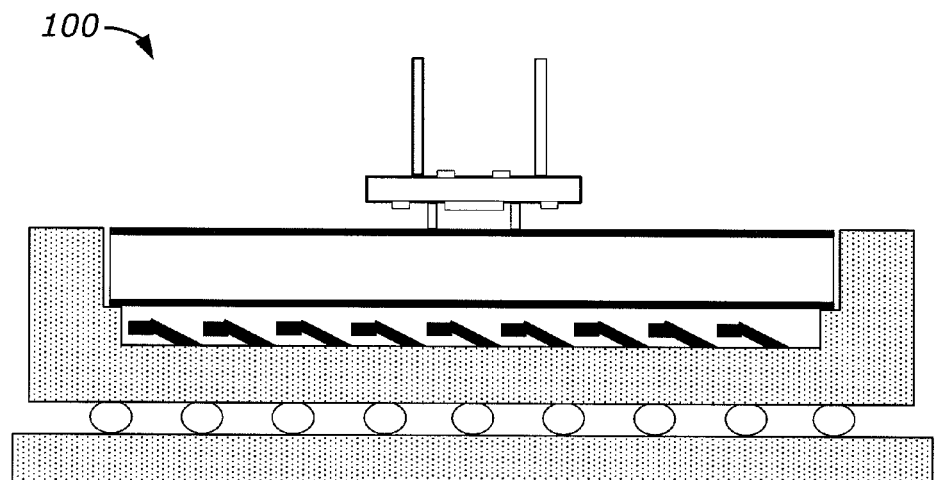

FIGS. 7A-7B illustrate in cross-section a portion of test setup 100 where the spacer is configured as part of component 110. Specifically, the spacer is embodied as housing spacers 155D which is formed as part of housing 111 of component 110. Housing spacers 155D are configured and arranged to prevent probe assembly 150 from contacting pins 116 when the probe assembly is inserted into the cavity of component 110. When probe assembly 150 is positioned for measuring, surfaces 194 contact a surface of probe assembly 150. Surface 194 may be positioned to extend above the upper surfaces of pins 116 by an amount that may be on the order of distance 199 (FIG. 2B). Though housing spacers 155D are shown along the perimeter of the cavity formed in component 110, housing spacers 155D may be configured as part of housing 111 in any suitable location.

FIGS. 2A-7B have illustrated embodiments of test setup 100 using a spacer to vertically (e.g. perpendicular to the surface of the circuit assembly) position probe assembly 150 with respect to pins 116 of component 110. Lateral (e.g. parallel to the surface of the circuit assembly) positioning of probe assembly 150 may be controlled to ensure that probe assembly 150 appropriately fits within a cavity of a component housing and that spacers appropriately engage to establish a vertical position. Any suitable technique may be used to laterally position probe assembly 150 relative to a component containing a pin under test. In some embodiments, lateral alignment may be achieved based on the shape of the spacer either alone or in combination with a compliant mechanism on probe assembly 150 that allows the lateral and/or vertical position of the probe assembly to be controlled by features on the probe assembly, a component and/or other parts of the circuit assembly.

Figure 8A:
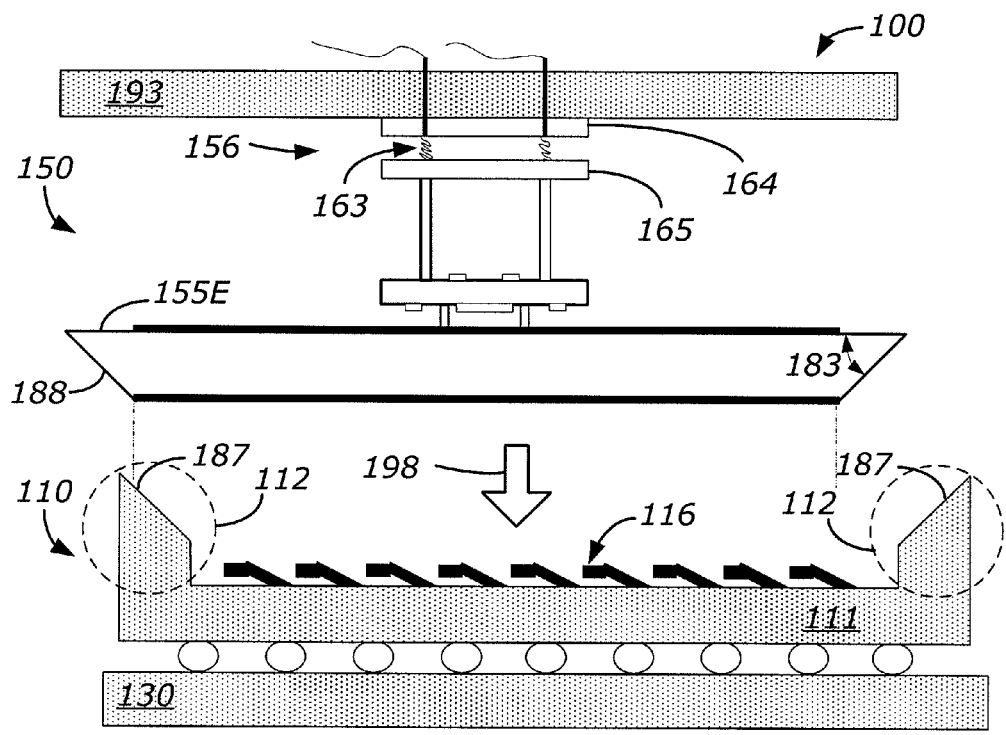
FIGS. 8A-8C are cross-sections illustrating a portion of a test setup at different stages of positioning a probe for capacitive testing of pins of a component, the probe having a beveled spacer adapted to self-align the probe upon contact a lip of a component housing.

Turning to FIG. 8A, probe assembly 150 is shown to be mounted to over-clamp 193 through a compliance subassembly 156. Compliance subassembly 156 allows for lateral and vertical movement of the probe with respect to fixture over-clamp 193. In some embodiments, compliance subassembly may additionally permit probe assembly 150 to rotate and/or tilt or move in other dimensions such that positioning of the probe assembly relative to a component under test is determined by alignment features.

Compliance subassembly 156, in combination with guiding features that guide the probe assembly 150 into a desired position relative to a component to be tested, allows the positioning accuracy of the probe to be lower than the accuracy required to properly position the probe with respect to the pins of a component to be tested.

In the embodiment illustrated, compliance subassembly 156 uses springs 163 to allow compliant motion. Here, compliance subassembly 156 is shown schematically to include a first member 164 rigidly coupled to over-clamp 193 and a second member 165 rigidly coupled to probe assembly 150. First member 164 and second member 165 are shown to be compliantly coupled through springs 163.

Other forms of compliant couplings may be used instead of or in addition to springs. Such compliant couplings may be formed from stretchable, bendable, or compressible materials, or any suitable complaint mechanism or combination of mechanisms. Though not shown for simplicity, compliance subassembly 156 may include other components, such as fasteners to connect it to over-clamp 193, or members that limit the range of compliant motion of probe assembly 150.

Compliance subassembly 156 may have different movement properties in the lateral direction than in the vertical direction and those movement properties need not be linear. For example, compliance subassembly 156 may more easily allow lateral movement than vertical movement. By allowing lateral movement with little resistance, compliance subassembly 156 may prevent the head of probe assembly 150 from getting "stuck" before spacers 155E are fully engaged and probe assembly 150 is properly positioned for testing component 110. On the other hand, a firm response to vertical pressure ensures that the spacers are fully engaged and the desired gap of distance 199 has been achieved.

In some embodiments, compliance subassembly 156 may permit vertical movement up to about 400 mils. Lateral movement of about 50 mils in any lateral direction may also be permitted. In various embodiments, compliance subassembly 156 allows movement in the vertical direction of at least 25, 50, 100, 200, 400 or 600 mils. In various embodiments, compliance subassembly 156 may allow movement in the lateral direction of at least 5, 10, 25, 50 or 100 mils. In some embodiments, compliance subassembly 156 returns probe assembly 150 to a neutral position when fixture over-clamp 193 is in the raised position.

FIG. 8A also provides an example of a spacer including guiding features that may be used to position a probe assembly. Guiding features may be implemented by appropriately shaping the surfaces contacted between probe assembly 150 and component 110 (and/or circuit assembly 120) when fixture over-clamp 193 is lowered to the test position. These surfaces may be beveled and/or tapered to guide probe assembly 150 to the desired measurement position. Though, surfaces of any suitable shape and position may be used.

Figure 8B:
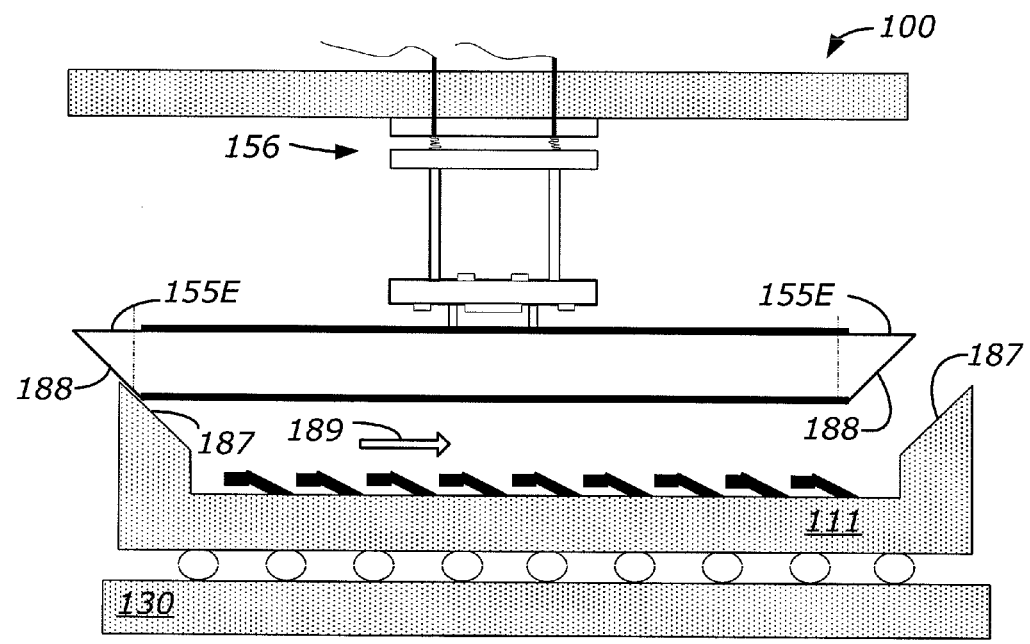
Figure 8C:
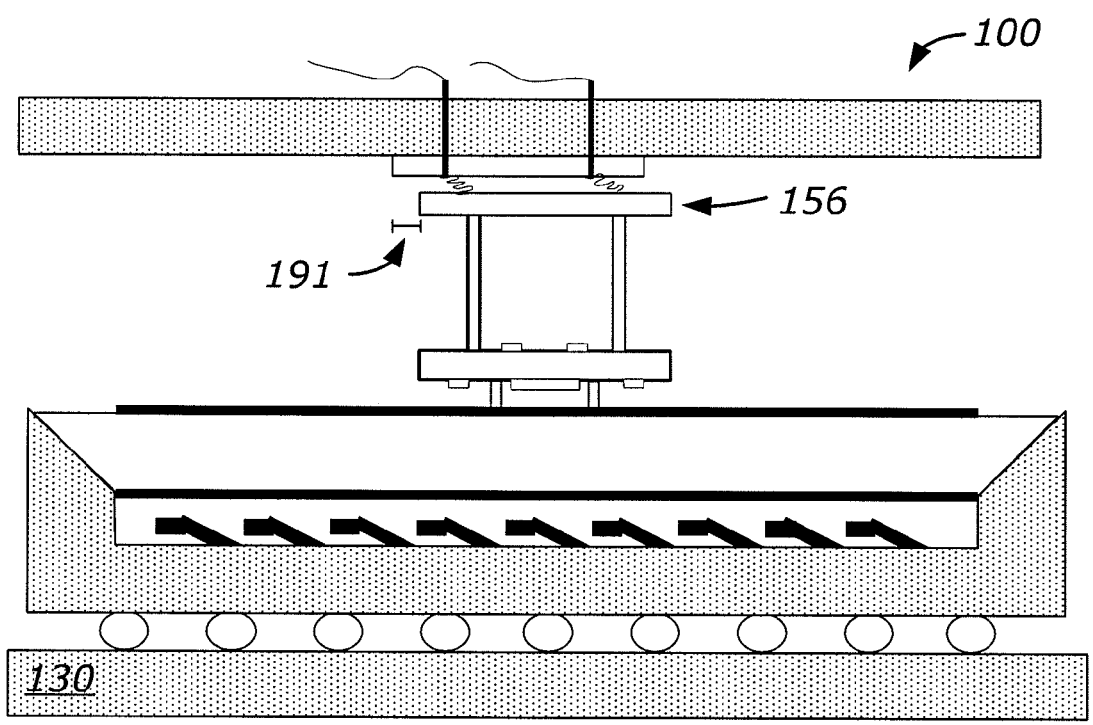

FIGS. 8A-8C illustrate positioning of a probe assembly in an embodiment in which the spacer is embodied as beveled spacers 155E. Beveled spacers 155E include a beveled surface 188 positioned to engage a surface 187 with a complementary bevel on housing 111 of component 110. Interaction of beveled surfaces 187 and 188 may guide probe assembly 150 into alignment with pins 116 of component 110. As probe assembly 150 is lowered in direction 198, the guiding features, here the beveled surfaces 187 and 188 interact to provide alignment.

The length of the beveled surfaces of may be selected to ensure that the maximum misalignment between probe assembly 150 and component 110 is accommodated. The maximum misalignment may be characteristic of the positioning accuracy of the fixture to which probe assembly 150 and circuit assembly 120 are attached. Misalignment of component 110 on circuit assembly 120 may also be a factor. The length of the beveled surface on probe assembly 150 and beveled surface on component 110 should be chosen to ensure the initial contact between the two is at the beveled surfaces. The surfaces are beveled with a steepness that ensures the friction between the contacted surfaces of probe assembly 150 and component 110 and the friction in compliance subassembly 156 is overcome. This allows probe assembly 150 to be properly laterally aligned with component 110 without getting stuck. A shallow bevel may be possible when there is low friction between the surfaces and within compliance subassembly 156. A steeper bevel relaxes the need for low friction, but may require component 110 have greater height. In some embodiments, the surfaces are beveled at an angle 183 have a value of at least 10 30 degrees. Though, in other embodiments, the angle may be at least 20 or 30 degrees. In yet other embodiments, the surfaces will be beveled at an angle of about 45 degrees+/−5 degrees.

Compliance subassembly 156 allows probe assembly 150 to shift laterally to be properly aligned with pins 116 of component 110. As shown in FIG. 8A, probe assembly 150 may be attached to over-clamp 193 so that it is not initially aligned with its desired position relative to component 110. As illustrated in FIG. 8B, as probe assembly 150 moves towards component 110, such as may occur when over-clamp 193 is closed to test a circuit assembly, the beveled surfaces will engage and, through a camming action associated with the motion of probe assembly 150 in direction 198, probe assembly 150 will move in direction 189. Motion in direction 189 is possible because compliance subassembly 156 provides enough compliance such that probe assembly shifts a distance 191 to properly align sense plate 151 with pins 116. As illustrated in FIG. 8C, the position of probe assembly 150 for testing is determined by the alignment features and spacers rather than the point of attachment of probe assembly to over-clamp 193.

Those of skill in the art will appreciate that probe assembly 150 and component 110 may be vertically and laterally aligned for test measurements using a spacer and guiding features of any suitable configuration. FIGS. 8A-8C illustrated an embodiment of test setup 100 with beveled spacers to facilitate alignment. Alternatively, beveled surfaces may be integrated into only one of probe assembly 150 and component 110 or alternatively or additionally into a surface of a circuit assembly. Moreover, it is not a requirement that the guiding features be beveled surfaces. Guiding features may be implemented using curved surfaces, conical surfaces, or surfaces of any other suitable shape. FIGS. 9A-9E illustrate further examples of embodiments with guiding features of different shapes and positions. FIGS. 9A-9E do not illustrate a compliant mounting.

However, the probe assemblies illustrated in these embodiments may similarly be used with a compliant mounting mechanism.

FIG. 9A illustrates in cross-section an embodiment where probe assembly 150 includes wing spacers 155F which are beveled "wings" for aligning the probe with a component 110 having a lip portion 112 (see FIG. 3A). Wing spacers 155F may extend beyond lip portion 112 such that each of the beveled wings, as probe assembly 150 moves towards a component under test, will contact a portion of lip 112, even if probe assembly 150 is not vertically aligned with the component. As probe assembly 150 moves closer to the component, the beveled surfaces 186 of wing spacers 155F will slide along the upper portions of lip 112, generating a vertical force that moves probe assembly 150 into proper alignment for a sense plate on the probe assembly to appropriately enter a cavity of the component. In this embodiment, the beveled wings also act as spacers, preventing the sense plate from contacting pins within the cavity once the probe assembly is partially inserted into the cavity. Because the vertical force will position probe assembly 150 with straight surfaces 185 contacting the upper surfaces of lip portion 112, wing spacers 155F can provide the same spacing as is illustrated in FIG. 2B.

FIG. 9B illustrates another embodiment where probe assembly 150 includes spacers 155G which include a number of beveled and tapered surfaces that act as guiding features. In some embodiments, the housing of a component (not shown) may be adapted to receive probe assembly 150, as shown in FIG. 9B, such that when probe assembly 150 is fully engaged with the component, the probe's sense plate is properly aligned and spaced with respect to the pins in the component.

FIG. 9C illustrates in cross-section another embodiment of probe assembly and component 110. Here, tapered spears 155H in probe assembly 150 and conical holes in housing 111 serve and as guiding features and spacers for vertically and laterally aligning probe assembly 150 with component 110. Similar considerations as were made in choosing the width and slope of a beveled edges may be used in selecting the width and slope of the taper. For example, the slope of the taper should be steep enough to overcome friction between the tapered piece, the surface which it contacts, and the internal friction of the compliance assembly.

FIG. 9D illustrates in cross-section yet another embodiment where guiding features and spacers are used to achieve lateral alignment and vertical alignment. Here spacers 155J have tapered spears which are used to provide lateral alignment and a collar ensure proper vertical alignment of probe assembly 150.

FIG. 9E illustrates in cross-section a further example embodiment where holes drilled in substrate 130 are used to align probe assembly 150 with component 110. Here spacers 155K have a spear portion that provides lateral alignment with the holes in substrate 130 and a riser portion that contacts the surface of component 110 holding the sense plate the desired distance from the pins.

Use of spacers and/or guiding features for achieving lateral and/or vertical positioning of a probe assembly in close proximity to pins of a component may increase the strength of a signal coupled to a sense plate of the probe assembly. Consequently, more accurate testing may be performed. Another approach from improving testing accuracy is to provide a low-capacitance probe. These techniques may be used alone or in combination.

FIG. 10A illustrates a cross section of a portion of a probe assembly 150. As illustrated, probe assembly 150 may further include a probe amplifier 154 electrically connected to sense plate 151. Probe amplifier 154 may be of any suitable design configured to amplify the response signal voltage detected on sense plate 151. In some embodiments, probe amplifier 154 is a differential amplifier with a first terminal electrically connected by a first electrical lead to guard plate 153 and with a second terminal electrically connected by a second electrical lead to sense plate 151. For example, probe amplifier 154 may be an operational amplifier. Though any suitable amplifier may be used. In some embodiments, probe amplifier 154 may be augmented with a filter or designed to filter the response signal. The filter characteristics may be determined, for example, in accordance with the tests being performed or test signals being used.

Sense plate 151 and guard plate 153 are capacitively coupled to each other through dielectric 152. The amplitude of the signal coupled to sense plate 151 from a pin under test may depend on the capacitance between sense plate 151 and guard plate 153. In some embodiments, it may be desirable to reduce the capacitance between sense plate 151 and guard plate 153 to provide a low capacitance probe.

A low capacitance probe may be provided in any suitable way. According to some embodiments, a low capacitance between the sense and guard plates is achieved by reducing a total surface area of guard plate 153 by introducing holes in its surface. When compared to a conventional probe performing the same test, the voltage on sense plate 151 of the low capacitance probe is larger before amplification by probe amplifier 154. Accordingly, the response signal measured on a low capacitance probe may have a superior signal to noise ratio, leading to more accurate testing. The probe capacitance may also be reduced by increasing the thickness of dielectric 152 and/or using a low-κ dielectric material.

FIG. 10B-10C show a top view of guard plate 153 and a top view of sense plate 151, respectively. Sense plate 151 and guard plate 153 may have any suitable shape, but in the embodiments illustrated are substantially planar structures. According to some embodiments, guard plate 153 has a plurality of holes 157 reducing the overall surface area of guard plate 153 (FIG. 10B). Holes 157 may be formed in guard plate 153 in any suitable way and may be sized and positioned to reduce the capacitance between sense plate 151 and guard plate 153. In the example illustrated, circular holes are formed using known printed circuit board manufacturing techniques to remove conductive material from guard plate 153.

It should be appreciated that the holes need not be filled with air. Any suitable approach that reduces the amount of conductive material at the surface of the guard plate 153 facing sense plate 151 may be used to form the holes. For example, the holes may be formed by removing material, embossing the plate to move conductive material away from the surface, reducing the thickness of conductive material, or reducing the conductance of conductive material. Any of these techniques to create holes may be achieved by removing or changing material once in the form of a plate or by depositing or otherwise selectively depositing or otherwise positioning material over only selected portions of a region.

In some embodiments, guard plate 153 is separated from sense plate 151 by a distance, d, and each of holes 157 has a diameter greater than d. For example, the holes may be circles with a diameter that is at least equal to the dielectric thickness 184. In some embodiments, the diameter may be 3 to 4 times the thickness. In yet some other embodiments, the diameter may be about 10 times the thickness. Though, the holes may have other shapes than circles. In some embodiments, whether or not the holes are circular, each hole 157 occupies an area of at least $\pi(n\, d/2)^2$, where n may be, for example, 1, 3, 4, or 10. For example, in one embodiment dielectric 152 has a thickness of about 50 mils and guard plate 153 has a plurality of circular holes each having a diameter of about 100 mils. In some embodiments, dielectric 152 has a thickness between 25 mils and 150 mils and the guard plate has holes each with a surface area in the range of 0.00049 to 0.0177 square inches ($in^2$).

Alternatively or additionally, capacitance may be reduced by removing a portion 158 from guard plate 153 when probe assembly 150 is configured to test components having a center portion without pins. For example, many LGA socket designs have such a center (see FIG. 1B). Accordingly, guard plate 153 may have a removed portion in its center region corresponding to the location in such a socket that is devoid of pins. A portion 159 may similarly be removed from sense plate 151 as shown in FIG. 10C. This removed portion may also correspond to a location in an LGA socket which is devoid of pins. In various embodiments, portions 158 and 159 may each have a surface area of about 0.1, 0.25, 0.5, or 0.75 $in^2$, though, in some embodiments the area may be greater or smaller. For example, in one embodiment portions 158 and 159 may each have dimensions of about 0.6 in.×0.8 in. (0.48 $in^2$).

Figure 11B:
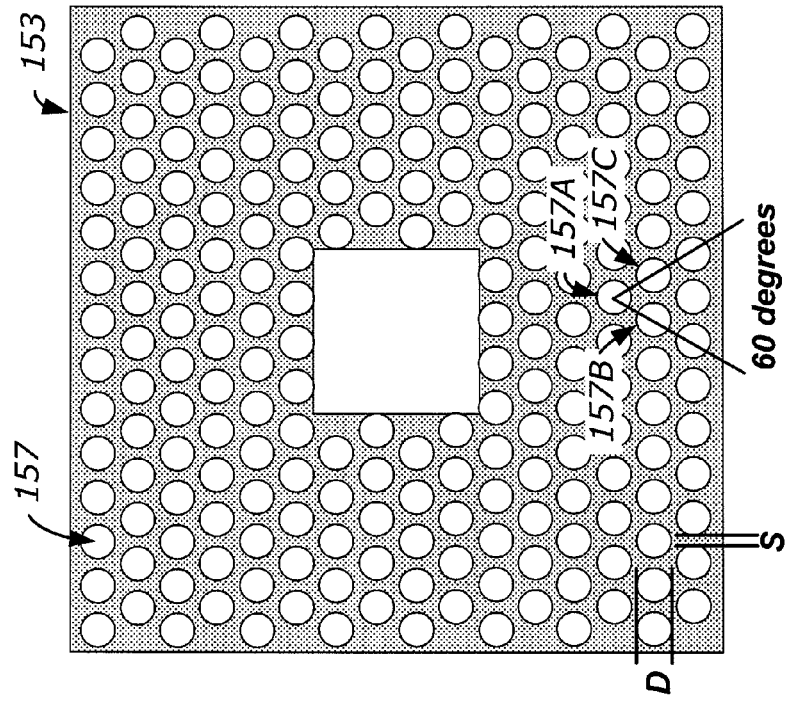
FIG. 11B is a plan view of a guard plate of a low capacitance probe according to yet other alternative embodiments.
Figure 11A:
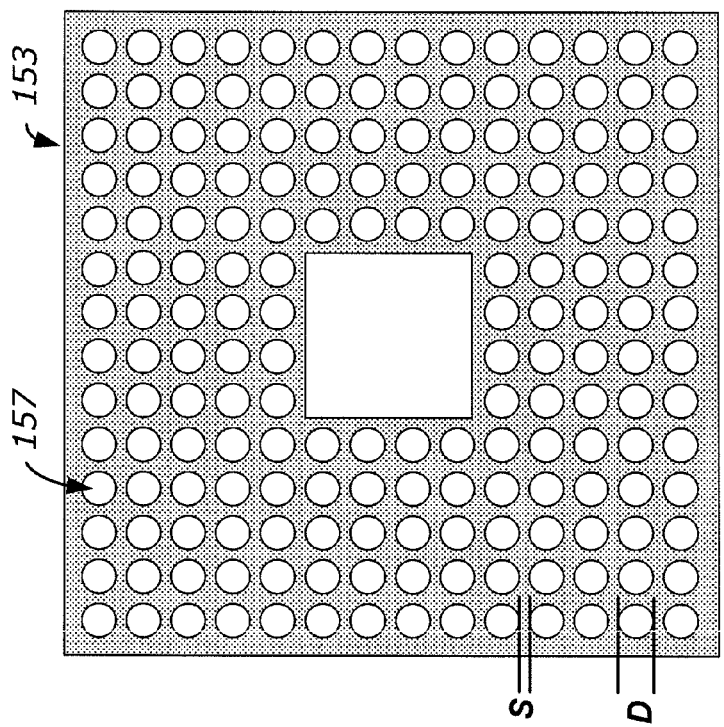
FIG. 11A is a plan view of a guard plate of a low capacitance probe according to some alternative embodiments.

FIGS. 11A-11B illustrate some additional embodiments of guard electrode 153 useful in a low capacitance probe. In FIG. 11A guard electrode 153 has holes 157 aligned vertically and horizontally in rows. As shown, the rows maybe parallel with one another and each row may include a plurality of holes 157. Holes 157 have a maximum dimension, D, and have an edge-to-edge spacing between adjacent member of a distance, S. In some embodiments, D is in the range of 70 mils (1.8 mm) to 130 mils (3.3 mm) and S is in the range of 27 mils (0.7 mm) to 33 mils (0.8 mm) In some embodiments, D is in the range of 50 to 100 mils and S is in the range of 10 to 30 mils. In some embodiments, D is in the range of 100 to 150 mils and S is in the range of 30 to 50 mils. Although any suitable value of D and S may be used.

FIG. 11B illustrates another embodiment of guard plate 153. Here holes 157 are aligned in rows which are staggered. In the example shown, the center of each of holes 157A, 157B and 157C form 60° angles with respect to the other two centers. In some embodiments, the rows are staggered such that an angle is created between a hole in a row and a nearest pair of holes in an adjacent row. For example, in various embodiments, the angle may be between 54° and 66°, or between 58° and 62°, or about 60°.

While sense plate 151 and guard plate 153 are shown having a square shape, it should be appreciated that they may take any suitable shape. In some embodiments, the plates are shaped to conform to a particular component to be tested.

It should be appreciated that while circular holes were shown for guard plate 153 in examples illustrated, the holes may take any shape and size. For example, the holes could be triangles, squares, diamonds, ovals, or any other shape or combination of shapes. The holes may be arranged in a hatched pattern. In some embodiments, holes 157 each have substantially the same size and shape. Though, in other embodiments, holes 157 need not be of the same size or shape. For example, holes may each have an irregular shape and have irregular spacing. Holes 157 may account for any suitable amount of the surface area of guard plate 153, as defined by the perimeter of the plate to reduce the capacitance as compared to a probe without holes 157 to a desired level. For example, sense plate 151 and guard plate 153 may each have an area defined by there respective perimeters. In some embodiments, the areas may be at least or at most 0.15, 0.5, 0.75, 1.0 or 3 in$^2$. In some embodiments, the holes may account for at least or at most 10 percent of the total area. Though, in other embodiments, the holes may account for a larger percentage of the total area, such as at least 25, 40 or 50 percent of the total area. In some embodiments, the capacitance between sense plate 151 and guard plate 153 is less than 100 picofarads (pF). In some embodiments, the capacitance is less than 35 pF. In some embodiments, the capacitance is in the range of 10 to 20 pF.

Having discussed some embodiments of test setup 100, methods of testing using test setup 100 and a method of manufacturing probe assembly 150 are briefly discussed with reference to FIGS. 12-14.

Figure 12:
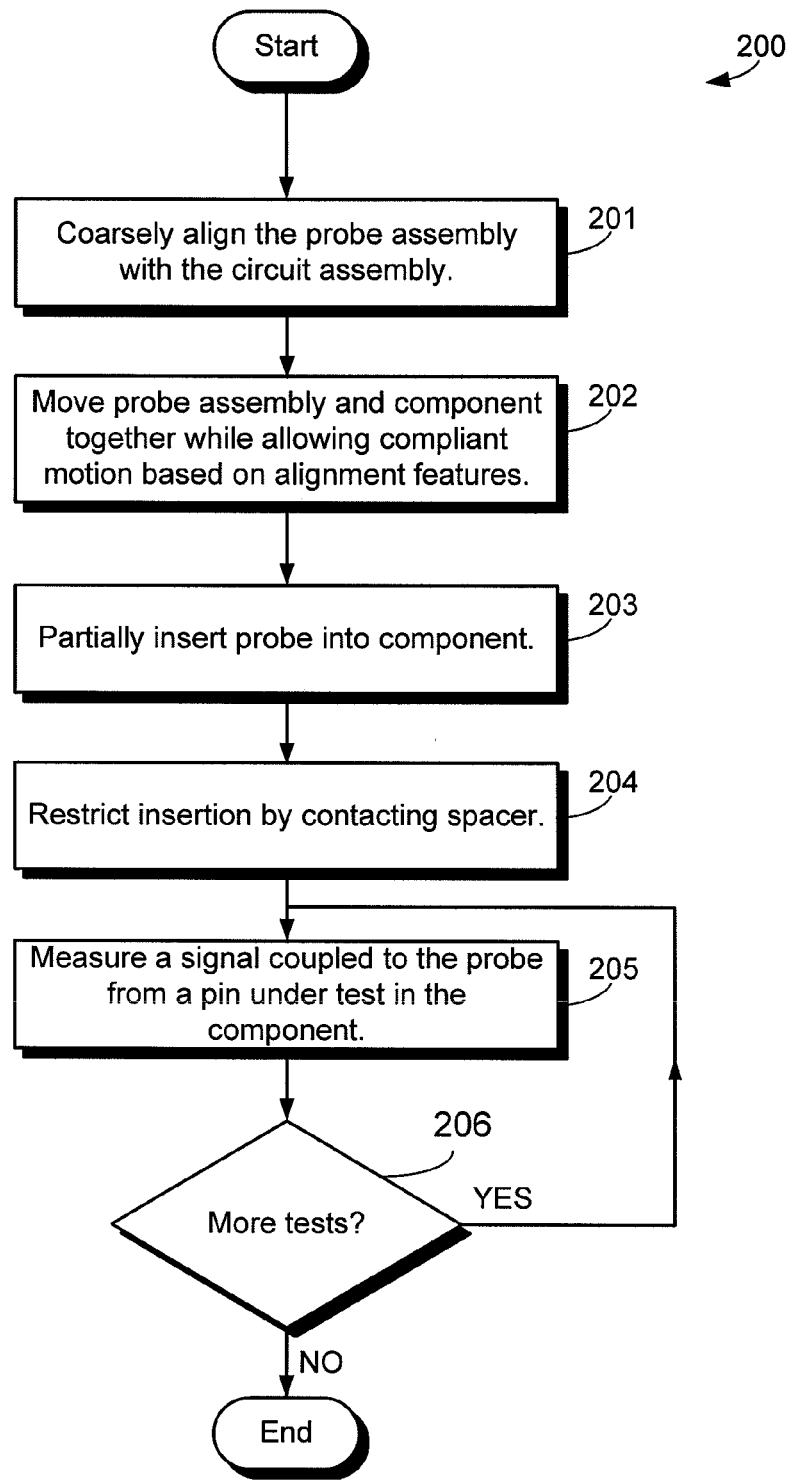
FIG. 12 is a flow diagram of a method for testing a circuit assembly according to some embodiments.

FIG. 12 is a flow chart of a method 200 of testing pins of a component.

At step 201, the probe assembly is coarsely aligned with the circuit assembly. The course alignment should be sufficient to ensure the alignment features between the probe assembly and circuit assembly are engaged when brought into contact with one another. Coarsely aligning the probe and circuit assembly may be performed, for example, placing the circuit assembly in a test fixture to which the probe is attached.

At step 202, the probe assembly and a component on the circuit assembly are moved together while allowing compliant motion based on the alignment features of the probe and/or circuit assembly. In some embodiments, the probe and circuit assembly are brought into contact and the alignment features cause compliant motion of the probe providing lateral alignment of the probe with pins in the component of the circuit assembly.

At step 203, the probe assembly is partially inserted into the component. The component may have a cavity formed therein to which the probe is partially inserted. For example, a socket may have a lip portion that surrounds part or all of the pins in the socket. The probe assembly is partially inserted into the component when at least a portion of the probe assembly is within the cavity formed in the component. For example, the sense plate of the probe assembly may be inserted into the cavity.

At step 204, insertion of the probe is restricted by a spacer. The spacer may be formed in any suitable way, for example, the spacer may be formed as a portion of the probe assembly, a portion of the component, a portion of the circuit assembly, or any suitable combination of the probe assembly, the component and the circuit assembly. In some embodiments, the spacer may comprise alignment features which work in tandem with the spacer to provider vertical and lateral alignment of the probe assembly with the component. Insertion is fully restricted by the spacer when a sense plate of the probe assembly is a predetermined distance from the pins in the component. Different portions of the spacer may be used to provide vertical and lateral alignment of the probe assembly with the component.

At step 205, a signal coupled to the sense plate of the probe assembly is measured. The signal may be coupled in response to excitation of one or more pins under test in the component. The pins under test may be excited in any suitable way. For example, the pin under test may be excited in accordance with capacitive opens testing techniques. In some embodiments, the response signal is suitably amplified and filtered by the probe assembly.

Optionally, the measured signal may be analyzed to determine, for example, if a pin under test is properly connected to the circuit assembly. For example, the magnitude of the measured signal may be compared to a threshold determined in a learn phase of testing. The result of comparing the magnitude with the threshold may be indicated through any suitable output device.

At step 206, a determination is made of whether there are any more tests to perform. For example, further tests may be performed to test other pins in the component. If another test is to be performed, method 200 returns to step 205 to conduct the subsequent test. If testing is complete, method 200 ends.

Figure 13:
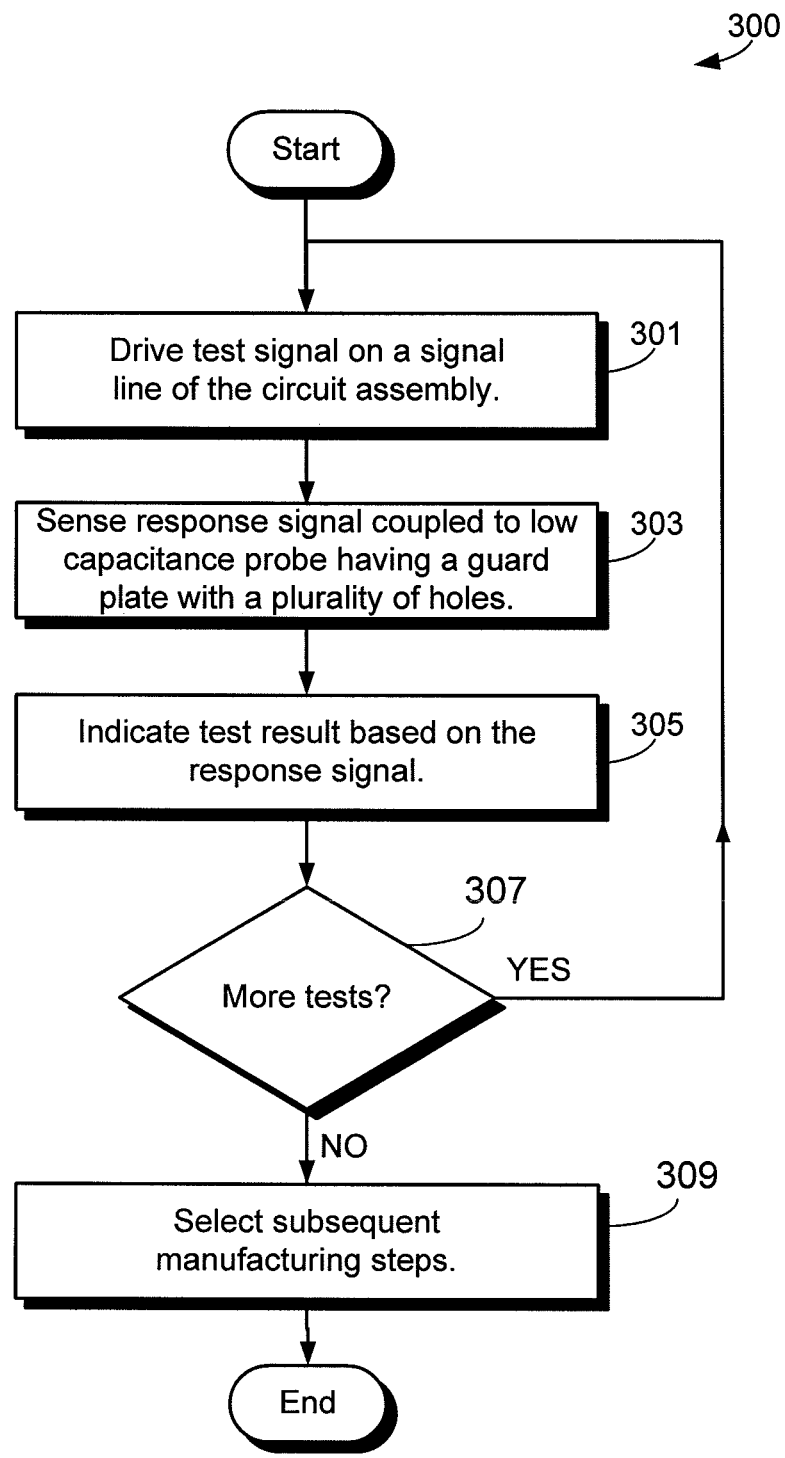
FIG. 13 is a flow diagram of a method for testing a circuit assembly according to some embodiments.

FIG. 13 shows a flow chart of a method 300 for testing a circuit assembly using a low capacitance probe assembly.

At step 301, a test signal is driven on a signal line of the circuit assembly. The test signal may be supplied by a test system or by a virtual circuit generator. Any suitable electrical signal may be used as a test signal.

At step 303, a response signal coupled to a low capacitance probe having a guard plate with a plurality of holes is sensed. For example, the response signal may be coupled to a sense plate of the probe, amplified and digitized by a test system for analysis. The holes on the low capacitance probe's guard plate may take any suitable form. In some embodiments, the holes account for at least 25% of the total surface area of the guard plate as defined by the area within the perimeter of the guard plate. In some other embodiments, the holes account for at least 50% of the surface area. In some other embodiments, the total area of the holes is at least 40% of the surface area of the sense plate as defined by the area within the perimeter of the sense plate. In yet some other embodiments, the total area of the holes is at least 50% of the surface area of the sense plate as defined by the area within the perimeter of the sense plate. Though, the holes may account for any suitable amount of guard plate surface area reduction.

At step 305, a test result is indicated based at least in part on the response signal measured at step 303.

At step 307, a determination is made as to whether there are any more tests to conduct. If the determination is yes, method 300 continues to step 301. If the determination is no, method 300 continues to step 309.

At step 309, subsequent steps in the manufacturing process are selected. The selection of the subsequent steps may be based, for example on the one or more test results indicated at step 305.

Methods 200 and 300 may each be used as an intermediary step in a manufacturing process for circuit assemblies. The measurement and/or test results collected as a result of performing method 200 and 300 may be used for each circuit assembly to determine which subsequent steps in the manufacturing process are to be performed for that circuit assembly. For example, if all tests performed on the component yielded a positive result a determination may be made that the component has been properly installed on the circuit assembly. If some tests have failed, a decision may be made to conduct subsequent tests, to replace the component, or take another suitable action. In some embodiments, method 200 is performed using a low capacitance probe assembly.

Figure 14:
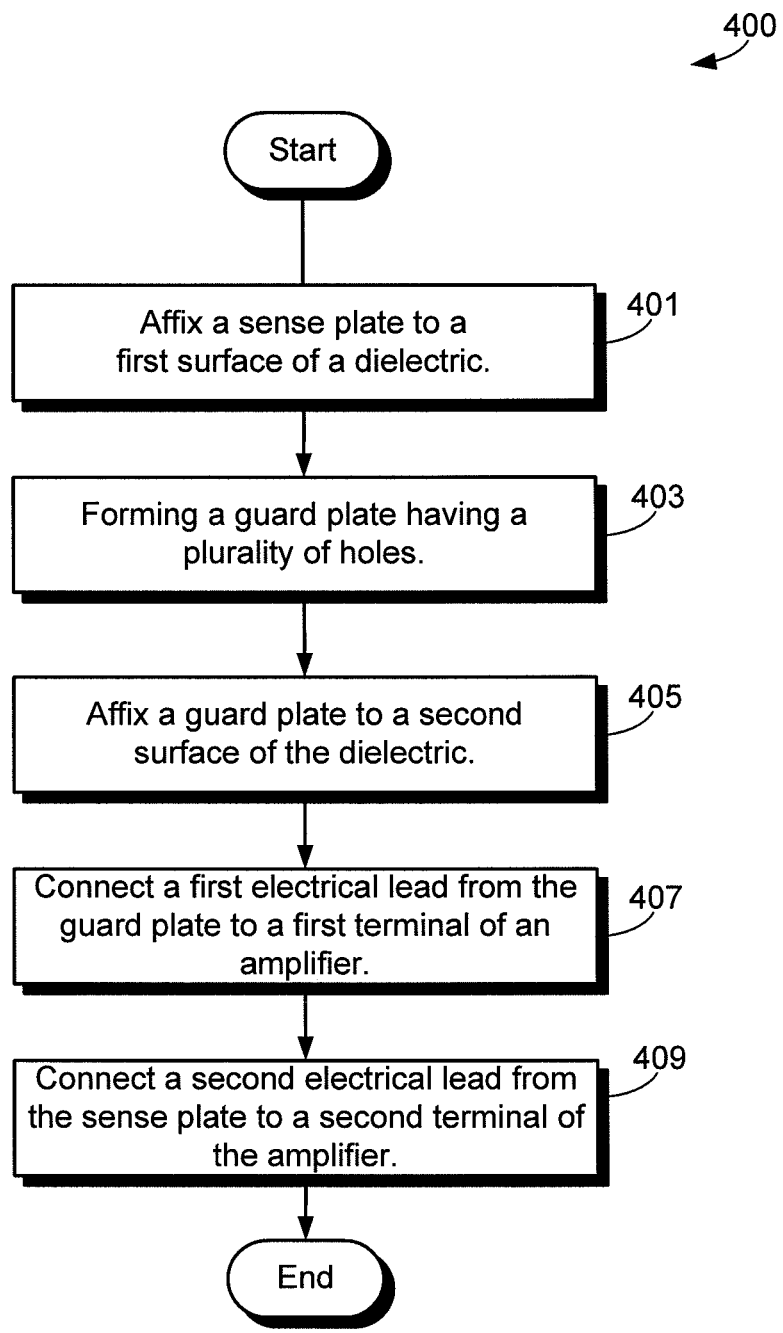
FIG. 14 is a flow diagram of a method of manufacturing a probe assembly.

FIG. 14 shows a flow chart of a method 400 for manufacturing a probe assembly.

At step 401, a sense plate is affixed to a first surface of a dielectric substrate. Sense plate may be affixed, for example, by gluing the plate to the dielectric substrate.

At step 403, a guard plate having a plurality of holes is formed and at step 405 the guard plate is affixed to a second surface of the dielectric substrate. Steps 403 and 405 may be performed in the order shown, in reverse order or performed simultaneously. For example, a plate may be glued to the dielectric substrate and then etched or milled with the desired holes. In another embodiment, the plate is deposited onto the dielectric substrate in a pattern with a plurality of holes. In yet another embodiment, holes are formed through a plate which is then affixed to the dielectric substrate. In some embodiments, the second surface is a surface substantially parallel to the first surface of the dielectric substrate. In various embodiments, the guard plate has 10, 20, 50, 75, 100, 150 or 200 or more holes. Though, the guard plate may have any suitable number of holes.

At step 407 a first electrical lead is connected from the guard plate to a first terminal of an amplifier.

At step 409, a second electrical lead is connected from the sense plate to a second terminal of the amplifier. In some embodiments, the second electrical lead is provided to the amplifier through one of the plurality of holes in the guard plate. More specifically a through hole through the dielectric substrate and the guard plate may be used to feed the second electrical lead from the sense plate to the amplifier. In some embodiments, the lead is passed through a hole in the guard plate separate from the plurality of holes. The hole the lead is passed through may be a center removed region of the guard plate corresponding to a center region without pins as in some LGA socket connectors.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A probe configured to test pins on a circuit assembly, the probe comprising:
a sense plate for receiving signals on the test pins through capacitive coupling;
a guard plate, parallel to the sense plate, comprising a plurality of holes sized and positioned to reduce capacitance between the sense plate and the guard plate, the plurality of holes having a total area comprising at least 25% of an area of a guard plate surface through which the plurality of holes are formed; and
a dielectric between the guard plate and the sense plate.

2. The probe of claim 1, wherein the guard plate is separated from the sense plate by a distance, d, and the holes each have a diameter greater than d.

3. The probe of claim 1, wherein:
the guard plate is separated from the sense plate by a distance, d; and
each of the plurality of holes have a surface area greater than $\pi(d/2)^2$.

4. The probe of claim 1, wherein the sense plate further comprises a hole in a center region of the sense plate having a surface area of at least $0.5 \text{ cm}^2$.

5. The probe of claim 1, wherein:
the guard plate surface comprises a substantially planar surface through which the plurality of holes are formed, the substantially planar surface being bounded by a perimeter and having an area within the perimeter; and
the total area of the plurality of holes comprises at least 25% of the area of the substantially planar surface bounded by the perimeter.

6. The probe of claim 5, wherein the total area of the plurality of holes comprises at least 50% of the area of the substantially planar surface bounded by the perimeter.

7. The probe of claim 1, wherein:
the sense plate comprises an area; and
a total area of the plurality of holes comprises at least 40% of the area of the sense plate.

8. The probe of claim 7, wherein a total area of the plurality of holes comprises at least 50% of an area bounded by the perimeter of the substantially planar surface of the sense plate.

9. The probe of claim 8, wherein the plurality of holes are each of substantially a same size and shape.

10. The probe of claim 8, wherein the plurality of holes are arranged in a plurality of rows on the substantially planar surface, each row comprising at least two holes of the plurality of holes.

11. The probe of claim 10, wherein,
each of the plurality of holes has a maximum dimension between 70 mils (1.8 mm) and 130 mils (3.3 mm), and
an edge-to-edge spacing between adjacent member of the at least two holes in each row is between 27 mils (0.7 mm) and 33 mils (0.8 mm).

12. The probe of claim 10, wherein each of the plurality of through holes is substantially circular.

13. The probe of claim 10, wherein each of the plurality of rows is staggered relative to an adjacent row.

14. The probe of claim 13, wherein the plurality of rows are staggered such that an angle between 54 and 66 degrees is created between a hole in a row and a nearest hole in an adjacent row.

15. The probe of claim 1, wherein a capacitance between the sense plate and the guard plate is less than 35 picofarads (pF).

16. The probe of claim 15, wherein the capacitance between the sense plate and the guard plate is in a range of 10 to 20 pF.

17. The probe of claim 1, further comprising an electrical lead connected to the sense plate and passing through a hole in the guard plate, the hole being separate from the plurality of holes.

18. The probe of claim 17, further comprising an amplifier electrically connected to the electrical lead and the guard plate.

19. A method of manufacturing circuit assemblies, the method comprising:
testing circuit assemblies in accordance with a method comprising, for each of a plurality of circuit assemblies:

driving a signal line on the circuit assembly with a test signal;

sensing a magnitude of a response signal comprising the test signal capacitively coupled from a pin under test to a probe having a sense plate for receiving the response signal, a guard plate comprising three or more holes, and a dielectric between the guard plate and the sense plate;

amplifying the response signal with an amplifier having an electrical lead connected to the sense plate, the electrical lead passing through a hole, separate from the three or more holes, in the guard plate; and indicating a test result based on the amplified response signal, the circuit assembly being tested after a first portion of a manufacturing process has been performed; and for each circuit assembly tested, selecting steps in a second portion of the manufacturing process based on the indicated test result.

20. The method of claim 19, wherein the three or more holes occupy a first area comprising at least 25% of an area bounded by the perimeter of a substantially planar surface of the guard plate.

21. The method of claim 20, wherein the first area comprises at least 50% of an area bounded by the perimeter of a substantially planar surface of the guard plate.

* * * * *